(12) United States Patent
Ideno et al.

(10) Patent No.: US 8,586,289 B2
(45) Date of Patent: Nov. 19, 2013

(54) AROMATIC HYDROCARBON RESIN AND COMPOSITION FOR FORMING UNDERLAYER FILM FOR LITHOGRAPHY

(75) Inventors: Ryuji Ideno, Tokyo (JP); Seiji Kita, Okayama (JP); Masashi Ogiwara, Okayama (JP); Gou Higashihara, Kanagawa (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 13/395,947

(22) PCT Filed: Sep. 14, 2010

(86) PCT No.: PCT/JP2010/065855
§ 371 (c)(1),
(2), (4) Date: Mar. 14, 2012

(87) PCT Pub. No.: WO2011/034062
PCT Pub. Date: Mar. 24, 2011

(65) Prior Publication Data
US 2012/0171611 A1    Jul. 5, 2012

(30) Foreign Application Priority Data

| Sep. 15, 2009 | (JP) | 2009-212953 |
| Jan. 29, 2010 | (JP) | 2010-018615 |
| Apr. 2, 2010 | (JP) | 2010-085987 |
| Jul. 6, 2010 | (JP) | 2010-153935 |

(51) Int. Cl.
*G03F 7/11* (2006.01)
*G03F 7/40* (2006.01)

(52) U.S. Cl.
USPC ........ 430/323; 430/271.1; 528/230; 528/232; 528/242; 528/236; 528/238; 528/235; 528/241; 528/234

(58) Field of Classification Search
None
See application file for complete search history.

(56) References Cited

U.S. PATENT DOCUMENTS

| 5,135,673 | A | * | 8/1992 | Murata et al. ............ 252/62.54 |
| 5,589,553 | A | | 12/1996 | Zampini et al. |
| 2003/0129505 | A1 | | 7/2003 | Shiraishi et al. |
| 2010/0119980 | A1 | * | 5/2010 | Rahman et al. ............ 430/313 |

FOREIGN PATENT DOCUMENTS

| DE | 4445619 A1 * | 6/1996 |
| EP | 0356915 A2 * | 3/1990 |
| EP | 0 735425 A2 | 10/1996 |
| EP | 2 210907 A1 | 7/2010 |
| EP | 2 219076 A1 | 8/2010 |
| EP | 2 236530 A1 | 10/2010 |
| JP | 2003-201324 A | 7/2003 |
| JP | 2006-161036 A | 6/2006 |
| JP | 2009-155638 A | 7/2009 |
| JP | 2010-013600 A | 1/2010 |

OTHER PUBLICATIONS

Raabe et al, English translation of DE 4445619 (A1) published Jun. 27, 1996 generated at Eespacenet website of European Patent Office (http://worldwide.espacenete.com on Jan. 25, 2012) with a total of 16 pages.*
Abstract (accession No. 1996;520898 obtained from SciFinder database) of DE 4445619 (A1) published Jun. 27, 1996, 5 pages.*
Roberts et al. J. ORg. Chem. 1987, 52, 1591-1599.*
Olah et al, J. Am. Chem. Soc. 1995, 117, 11211-11214.*
Prakash et al, J. ORg. Chem. 2009, 74, 8659-8668 published on Web Oct. 28, 2009.*
Saito et al J. Am. Chem. Sc. 1995, 117, 11081-11084.*
International Search Report dated Dec. 7, 2010, corresponding with International Application PCT/JP2010/065855.
Y. Shangxian et al., "Molecular Design of Binder Resins Used in Positive Photoresists", Journal of Photopolymer Science and Technology, vol. 10, No. 2, 1997, pp. 283-292.
Ranee Kwong et al., "IBM 193nm Bilayer Resist: Materials, Lithographic Performance and Optimization", Proceedings of SPIE, vol. 4345, 2001, pp. 50-57.

* cited by examiner

*Primary Examiner* — Cynthia Hamilton
(74) *Attorney, Agent, or Firm* — Fitch, Even, Tabin & Flannery, LLP

(57) ABSTRACT

The aromatic hydrocarbon resin can be used as a coating material and a resist resin for a semiconductor, and has a high carbon concentration and a low oxygen concentration. A composition for forming an underlayer film for lithography that has excellent etching resistance as an underlayer film for a multilayer resist process, an underlayer film formed with the same, and a pattern forming method using the same are disclosed. An aromatic hydrocarbon is reacted with an aromatic aldehyde in the presence of an acidic catalyst, thereby providing an aromatic hydrocarbon resin that has a high carbon concentration of from 90 to 99.9% by mass and a low oxygen concentration of from 0 to 5% by mass. A composition for forming an underlayer film for lithography contains the resin and an organic solvent, an underlayer film is formed with the same, and a pattern forming method uses the same.

11 Claims, 10 Drawing Sheets

⟨Example 2⟩

1H-NMR(CDCl3)

13C-NMR(CDCl3)

(Example 2)

IR

⟨Example 5⟩

1H-NMR(CDCl3)

13C-NMR(CDCl3)

⟨Example 5⟩

IR

⟨Example 6⟩

1H-NMR(CDCl3)

13C-NMR(CDCl3)

⟨Example 6⟩

IR

⟨Example 7⟩

1H-NMR(CDCl3)

13C-NMR(CDCl3)

⟨Example 7⟩

IR

⟨Example 8⟩

1H-NMR(CDCl3)

13C-NMR(CDCl3)

⟨Example 8⟩

IR

AROMATIC HYDROCARBON RESIN AND COMPOSITION FOR FORMING UNDERLAYER FILM FOR LITHOGRAPHY

CROSS-REFERENCE TO RELATED APPLICATIONS

This is the U.S. National Phase Application of International Application PCT/JP2010/065855, filed Mar. 24, 2011, and claims the benefit of foreign priority from Japanese Patent Application 2009-212953, filed Sep. 15, 2009, Japanese Patent Application 2010-018615, filed Jan. 29, 2010, Japanese Patent Application 2010-085987, filed Apr. 2, 2010, and Japanese Patent Application 2010-153935, filed Jul. 6, 2010, the entire disclosures of which applications are hereby incorporated herein by reference.

TECHNICAL FIELD

The present invention relates to an aromatic hydrocarbon resin capable of being used as an electric insulating material, a resist resin, a sealing resin for a semiconductor, an adhesive for a printed circuit board, a matrix resin for an electric laminated board mounted on an electric device, an electronic device, an industrial device and the like, a matrix resin for a prepreg mounted on an electric device, an electronic device, an industrial device and the like, a material for a build-up laminated board, a resin for fiber-reinforced plastics, a sealing resin for a liquid crystal display panel, a paint composition, various kinds of coating materials, an adhesive, a coating material for a semiconductor, and a resist resin for a semiconductor. The present invention also relates to a composition for forming an underlayer film for lithography that is effective in a multilayer resist process used in microfabrication in a production process of a semiconductor device or the like, and a method for forming a photoresist pattern using the composition for forming an underlayer film for lithography.

BACKGROUND ART

A reaction of a phenol compound and formaldehyde in the presence of an acidic catalyst has been known as a reaction for producing a phenol-novolak resin or the like. It has been also disclosed that an aldehyde compound, such as acetaldehyde, propionaldehyde, isobutyl aldehyde, crotonaldehyde and benzaldehyde, is reacted to produce a polyphenol compound (Patent Document 1) and a novolak resin (Patent Document 2).

It has been also disclosed that a hydroxybenzaldehyde or the like, which has both functions of phenol and aldehyde, is reacted to produce a novolak type resin (Patent Document 3).

The polyphenol compounds and the novolak resins are used as a coating material and a resist resin for a semiconductor, and is demanded to have heat resistance as one of the capabilities of these purposes. It has been ordinarily known that the heat resistance is enhanced by increasing the carbon concentration in the resin or decreasing the oxygen concentration therein. A method of increasing the carbon concentration and decreasing the oxygen concentration includes a method of introducing an aromatic hydrocarbon component. Under the circumstances, a polymer having the structure represented by the following formula (i.e., a acenaphthene resin) has been known (Patent Document 4).

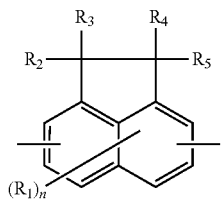

wherein $R_1$ represents a monovalent atom or a group; n represents an integer of from 0 to 4; and $R_2$ to $R_5$ each independently represent a hydroxyl group or a monovalent atom or group.

However, the material has problems that it is expensive, severe reaction conditions are required for producing the resin, many reaction steps are required to make the reaction complicated, and the like.

Microfabrication by lithography using a photoresist composition is performed in production of semiconductor devices, and associated with the increase of integration degree and increase of speed of an LSI in recent years, further miniaturization through pattern rules is demanded, but the lithography using light exposure used as a recently general-purpose technique is now approaching the essential limitation in resolution derived from the wavelength of light source.

The light source for lithography used upon forming a resist pattern has a decreasing wavelength from a KrF excimer laser (248 nm) to an ArF excimer laser (193 nm). Associated with the miniaturization of the resist pattern, however, the problems of resolution and collapse of the resist pattern after development occur, which derive a demand of thinning of the resist. Accordingly, it is difficult to assure the thickness of the resist pattern that is sufficient for processing the substrate, and thus such a process may be required that the function of mask is imparted not only to the resist pattern, but also to a resist underlayer film formed between the resist and the substrate to be processed. As the resist underlayer film for the process, currently, such resist underlayer films are being demanded as a resist underlayer film for lithography that has a selective ratio of dry etching rate close to the resist, a resist underlayer film for lithography that has a selective ratio of dry etching rate smaller than the resist, and a resist underlayer film for lithography that has a selective ratio of dry etching rate smaller than the semiconductor substrate, which are different from the ordinary resist underlayer film having a large dry etching rate. These resist underlayer films may also be imparted with an antireflection function, and thus may also have a function of an ordinary antireflection film (see, for example, Patent Documents 5, 6 and 7).

The present inventors have proposed, as a material that is imparted with an antireflection function to an ArF excimer laser and has high etching resistance, a composition for forming an underlayer film containing a naphthalene formaldehyde polymer (see Patent Document 8). For conducting further miniaturization of the resist pattern, however, there is a demand of further enhancing the etching resistance.

A two-layer resist method has also been proposed, which is superior to the three-layer resist method owing to the less number of process steps. In the two-layer resist method, after forming an underlayer film on a substrate in the similar manner as in the three-layer resist method, a photoresist film containing a silicon-containing polymer is formed as an upper layer thereof, a resist pattern is formed by an ordinary photolithography technique, and etching with oxygen plasma is performed with the resist pattern as a mask, thereby transferring the resist pattern to the underlayer film. Etching with a carbon fluoride gas or the like is then performed with the resist pattern as a mask, thereby forming the pattern on the substrate (Non-patent Document 1).

PRIOR ART DOCUMENTS

Patent Documents

Patent Document 1: JP-A-6-1741
Patent Document 2: JP-A-2004-511584
Patent Document 3: JP-A-2008-88197
Patent Document 4: JP-A-2000-143937
Patent Document 5: JP-A-2004-177668
Patent Document 6: JP-A-2004-271838
Patent Document 7: JP-A-2005-250434
Patent Document 8: WO2009/072465

Non-Patent Document

Non-patent Document 1: Proceedings of SPIE, vol. 4345 (2001), 50

SUMMARY OF THE INVENTION

Problems to be Solved by the Invention

An object of the present invention is to provide an aromatic hydrocarbon resin that has a high carbon concentration and a low oxygen concentration, capable of being used as an electric insulating material, a resist resin, a sealing resin for a semiconductor, an adhesive for a printed circuit board, a matrix resin for an electric laminated board mounted on an electric device, an electronic device, an industrial device and the like, a matrix resin for a prepreg mounted on an electric device, an electronic device, an industrial device and the like, a material for a build-up laminated board, a resin for fiber-reinforced plastics, a sealing resin for a liquid crystal display panel, a resin for a paint composition, various kinds of coating materials, an adhesive, a coating material for a semiconductor, or a resist for a semiconductor.

Another object of the present invention is to provide a composition for forming a novel photoresist underlayer film excellent in etching resistance as an underlayer film for a multilayer resist, an underlayer film having excellent in etching resistance formed with the same, and a method for forming a pattern using the same.

Means for Solving the Problems

The present invention relates to:

(1) an aromatic hydrocarbon resin obtained by reacting an aromatic hydrocarbon represented by the formula (1) and an aldehyde represented by the formula (2) in the presence of an acidic catalyst:

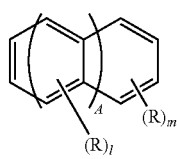

(1)

wherein R represents hydrogen or an alkyl group having from 1 to 4 carbon atoms; l and m each represents a number of 1 to 3; and A represents a number of from 0 to 2, provided that when any of l and m is 2 or more, plural groups represented by R may be the same as or different from each other,

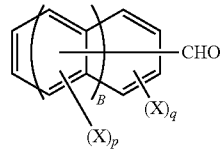

(2)

wherein X represents hydrogen, an alkyl group having from 1 to 10 carbon atoms, an aryl group having from 6 to 10 carbon atoms, a cyclohexyl group, a hydroxyl group, a formyl group or a carbonyl group; p and q each represents a number of from 1 to 3; and B represents a number of from 0 to 2, provided that when any of p and q is 2 or more, plural groups represented by X may be the same as or different from each other, (2) a composition for forming an underlayer film for lithography, for forming an underlayer film between a substrate and a resist layer, containing at least the aromatic hydrocarbon resin according to the item (1) and an organic solvent, (3) an underlayer film for lithography, formed with the composition for forming an underlayer film for lithography according to the item (2), and (4) a method for forming a multilayer resist pattern, containing: forming an underlayer film with the composition for forming an underlayer film according to the item (2), on a substrate; forming at least one photoresist layer on the underlayer film; irradiating a necessary region of the photoresist layer with a radiation; developing the photoresist layer with an alkali to form a resist pattern; and etching the underlayer film with plasma containing at least oxygen gas, with the resist pattern as a mask, thereby transferring the resist pattern to the underlayer film.

Advantages of the Invention

The aromatic hydrocarbon resin of the present invention has a high carbon concentration and a low oxygen concentration, and thus is useful as a resin used as an electric insulating material, a resist resin, a sealing resin for a semiconductor, an adhesive for a printed circuit board, a matrix resin for an electric laminated board mounted on an electric device, an electronic device, an industrial device and the like, a matrix resin for a prepreg mounted on an electric device, an electronic device, an industrial device and the like, a material for a build-up laminated board, a resin for fiber-reinforced plastics, a sealing resin for a liquid crystal display panel, a paint composition, various kinds of coating materials, an adhesive, a coating material for a semiconductor, and a resist resin for a semiconductor.

The use of the composition for forming an underlayer film for lithography of the present invention may provide an underlayer film that is excellent in etching resistance to oxygen plasma etching or the like, and the use of the underlayer film may provide an excellent resist pattern.

MODE FOR CARRYING OUT THE INVENTION

Aromatic Hydrocarbon Resin

Figure 1:
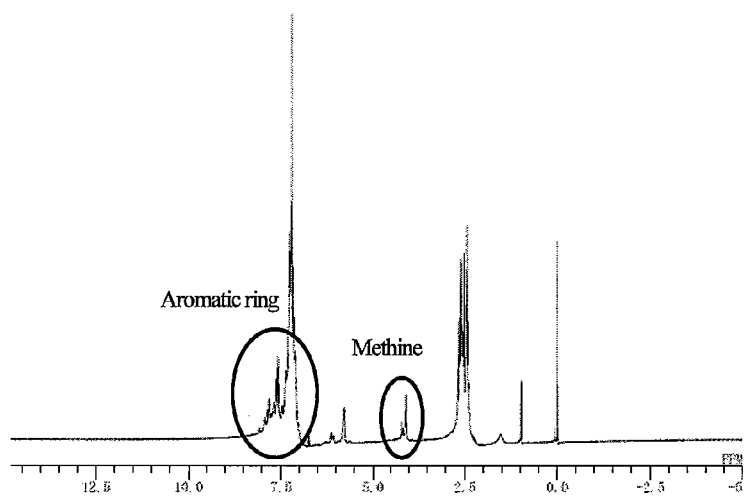
[FIG. 1] The figure is a diagram showing the $^1$H and $^{13}$C NMR spectra of the resin (NF-2) obtained in Example 2 according to the present invention.
Figure 1:
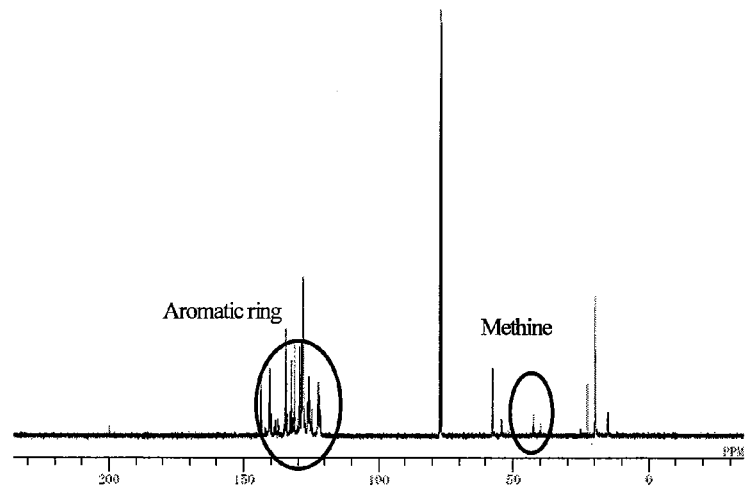

The present invention relates to an aromatic hydrocarbon resin obtained by reacting an aromatic hydrocarbon represented by the formula (1) and an aldehyde represented by the formula (2) in the presence of an acidic catalyst. Specifically, the aromatic hydrocarbon resin of the present invention may contain a polymer obtained by reacting an aromatic hydrocarbon represented by the formula (1) and an aldehyde represented by the formula (2) in the presence of an acidic catalyst.

The molar ratio (aromatic hydrocarbon/aldehyde) upon reacting the aromatic hydrocarbon represented by the formula (1) and the aldehyde represented by the formula (2) may be from 1/0.1 to 1/6, preferably from 1/0.3 to 1/6, more preferably from 1/0.5 to 1/6, further preferably from 1/0.5 to 1/4, and particularly preferably from 1/0.5 to 1/2. When the molar ratio of the aromatic hydrocarbon represented by the formula (1) and the aldehyde represented by the formula (2) is in the range, the resin yield of the aromatic hydrocarbon resin thus obtained can be maintained to a relatively high level and can decrease the amount of the aldehyde remaining unreacted.

The condensation reaction of the aromatic hydrocarbon represented by the formula (1) and the aldehyde represented by the formula (2) is performed in the presence of an acidic catalyst generally under ordinary pressure, while refluxing by heating at a temperature (generally from 80 to 250° C.) equal to or higher than the temperature where the raw materials and modifier used are dissolved in each other, or while distilling off water or the like thus generated. The reaction may be performed under increased pressure depending on necessity.

Furthermore, a solvent that is inert to the condensation reaction may be used depending on necessity. Examples of the solvent include a saturated aliphatic hydrocarbon, such as heptane and hexane; an alicyclic hydrocarbon, such as cyclohexane; an ether, such as dioxane and dibutyl ether; an alcohol, such as 2-propanol; a ketone, such as methyl isobutyl ketone; and a carboxylic acid, such as acetic acid.

The acidic catalyst that can be used in the condensation reaction may be appropriately selected from known inorganic acids and organic acids, examples of which include a mineral acid, such as hydrochloric acid, sulfuric acid and phosphoric acid; an organic acid, such as oxalic acid, formic acid, p-toluenesulfonic acid, methanesulfonic acid, trifluoroacetic acid and trifluoromethanesulfonic acid; a Lewis acid, such as zinc chloride, aluminum chloride, iron chloride and boron trifluoride; and a solid acid, such as silicotungstic acid, phosphotungstic acid, silicomolybdic acid and phosphomolybdic acid, and p-toluenesulfonic acid, methanesulfonic acid, trifluoromethanesulfonic acid and phosphotungstic acid are preferred from the standpoint of production.

The amount of the acidic catalyst used is preferably controlled to an amount of from 0.01 to 100 parts by mass, more preferably from 0.01 to 10 parts by mass, further preferably from 0.1 to 10 parts by mass, and particularly preferably from 0.1 to 5 parts by mass, per 100 parts by mass of the total amount of the aromatic hydrocarbon represented by the formula (1) and the aldehyde represented by the formula (2). When the amount of the catalyst used is in the range, a suitable reaction rate may be obtained, and furthermore increase of the resin viscosity due to large reaction rate may be prevented from occurring.

The reaction time is preferably from 1 to 10 hours, and more preferably approximately from 2 to 8 hours. When the reaction time is in the range, a modified resin having a target property can be obtained economically and industrially advantageously.

After completing the reaction, the solvent is added depending on necessity for dilution, the reaction mixture is allowed to stand for separating into two phases, the resin phase as the oily phase is separated from the aqueous phase and then rinsed with water for removing the acidic catalyst completely, and the solvent added and the unreacted modifier are removed by an ordinary method, such as distillation, thereby providing the modified resin.

The polymer constituting the aromatic hydrocarbon resin of the present invention preferably has at least a structure represented by the following formula (3):

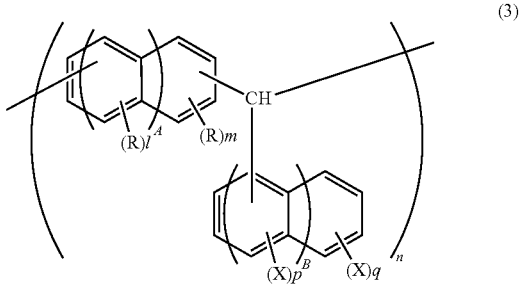

(3)

wherein n represents a number that satisfies the mass average molecular weight of the polymer described later, which is, for example, a number of from 1 to 50, and preferably a number of from 3 to 40; and R, X, l, m, p and q have the meanings described above.

Examples of the aromatic hydrocarbon represented by the formula (1) include benzene, toluene, xylene, trimethylbenzene, naphthalene, methylnaphthalene, dimethylnaphthalene and anthracene, which may be used solely or as a combination of two or more kinds thereof. In the present invention, xylene, trimethylbenzene, naphthalene, methylnaphthalene, dimethylnaphthalene and anthracene are preferred, naphthalene, methylnaphthalene, dimethylnaphthalene and anthracene are more preferred, and naphthalene, methylnaphthalene and dimethylnaphthalene are particularly preferred, from the total standpoint including superiority of supplying a raw material, easiness of manufacturing a resin, the etching resistance capability and the like.

Examples of the aldehyde compound represented by the formula (2) include benzaldehyde, methylbenzaldehyde, ethylbenzaldehyde, propylbenzaldehyde, butylbenzaldehyde, cyclohexylbenzaldehyde, biphenylaldehyde, hydroxybenzaldehyde, dihydroxybenzaldehyde, naphthaldehyde and hydroxynaphthaldehyde, which may be used solely or as a combination of two or more kinds thereof.

The aromatic hydrocarbon resin of the present invention or the polymer constituting the resin (which may be hereinafter referred to as an "aromatic hydrocarbon resin (polymer)" in some cases) preferably has a carbon concentration of from 90 to 99.9% by mass. When the carbon concentration is in the range, the demanded heat resistance may be satisfied.

The aromatic hydrocarbon resin (polymer) of the present invention preferably has an oxygen concentration of from 0 to 5% by mass, more preferably from 0 to 3% by mass, and further preferably from 0 to 1% by mass. When the oxygen concentration is 5% by mass or less, the demanded heat resistance may be satisfied.

The carbon concentration and the oxygen concentration described herein mean the percentages by mass of carbon and oxygen, respectively, contained in the aromatic hydrocarbon resin (polymer).

The molecular weight of the aromatic hydrocarbon resin (polymer) of the present invention is not particularly limited, and when the weight average molecular weight (Mw) thereof exceeds 50,000, the viscosity thereof may become too large to fail to be perform spin coating in some cases. The weight average molecular weight Mw is preferably from 800 to 10,000, more preferably from 1,000 to 10,000, further preferably from 1,000 to 5,000, and still further preferably from 2,000 to 5,000. When the weight average molecular weight is in the range, excellent solubility may be obtained, and excellent heat resistance and reduction of the outgas may be obtained.

The residual metal amount of the aromatic hydrocarbon resin (polymer) is preferably 1,000 ppb or less, further preferably 100 ppb or less, and particularly preferably 50 ppb or less, from the standpoint of suppression of metal contamination, for example, in a purpose of electronic material. Examples of the method of reducing the residual metal amount include a method of rinsing the resin solution with ultrapure water and the like and a method of making it into contact with an ion exchange resin, but the method is not particularly limited.

In the polymer, an epoxy group may be introduced to the phenolic hydroxyl group thereof, whereby the curing property of the resin is enhanced, and thus the outgas can be reduced. A resin having a phenolic hydroxyl group is reacted with an epoxy-containing compound, such as epichlorohydrin, thereby introducing an epoxy group thereto by the action of base.

Composition for Forming Underlayer Film for Lithography

The composition for forming an underlayer film for lithography of the present invention is a composition for forming an underlayer film that forms an underlayer film between a substrate and a resist layer, and contains at least the aromatic hydrocarbon resin and an organic solvent. The aromatic hydrocarbon resin contains a polymer obtained by reacting the aromatic hydrocarbon represented by the formula (1) and the aldehyde represented by the formula (2) in the presence of an acidic catalyst.

The composition for forming an underlayer film for lithography of the present invention contains the aromatic hydrocarbon resin (polymer) of the present invention in an amount of preferably from 1 to 33 parts by weight, and more preferably from 2 to 25 parts by weight, per 100 parts by weight of the composition including the organic solvent.

The composition for forming an underlayer film for lithography of the present invention preferably contains at least one of a polyphenol compound represented by the following general formula (4-1) or (4-2) from the standpoint of a crosslinking capability imparted thereto. The composition may contain a nuclear hydrogenated compound of the polyphenol compound represented by the general formula (4-1) or (4-2):

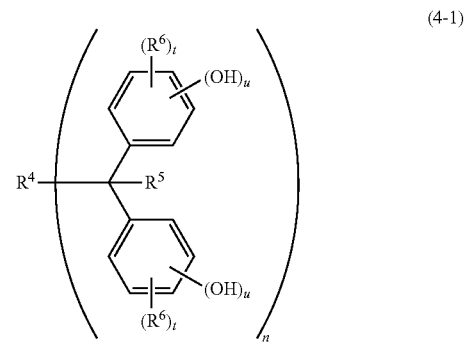

(4-1)

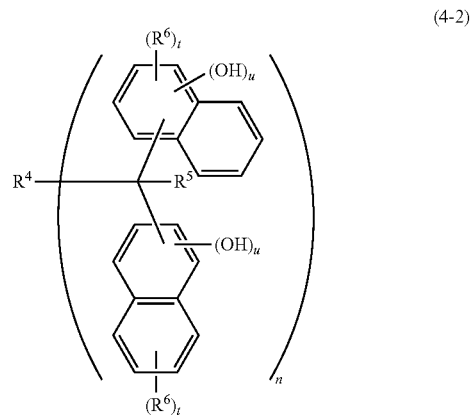

(4-2)

In the formula (4-1) or (4-2), $R^4$ represents a monovalent to tetravalent substituent having from 10 to 18 carbon atoms and having at least one structure selected from a naphthalene structure, a phenanthrene structure, a pyrene structure, a fluorene structure, an acenaphthene structure, a 1-ketoacenaphthene structure, a benzophenone structure, a xanthene structure, a thioxanthene structure, a norbornane structure, a cyclohexane structure, a tricyclodecane structure, an adamantane structure, a bicyclooctane structure, and nuclear hydrogenated structures of these structures;

$R^6$ represents a substituent selected from the group consisting of a halogen atom, an alkyl group having from 1 to 6 carbon atoms, an alkoxy group, a norbornyl group, a cyclohexyl group, a tricyclodecyl group, an adamantyl group, a decahydronaphthyl group and a bicyclooctyl group;

n represents an integer of from 1 to 4; t represents an integer of from 0 to 4; and u represents an integer of from 1 to 4, provided that the condition $1 \leq t+u \leq 5$ is satisfied.

When n, t and u are each 2 or more, plural groups or integers of $R^5$, $R^6$, t, u and n may each be the same as or different from each other.

$R^5$ represents a substituent selected from the group consisting of a hydrogen atom and an alkyl group having from 1 to 6 carbon atoms, and may be bonded to $R^4$ through a single bond.

Specific examples of the general formula (4-1) or (4-2) include structures (5) shown below.

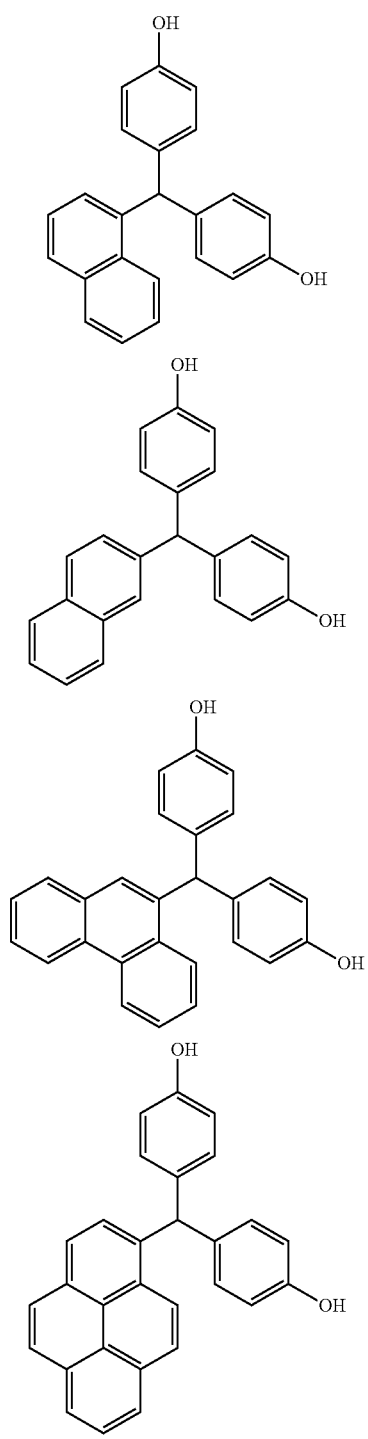

-continued

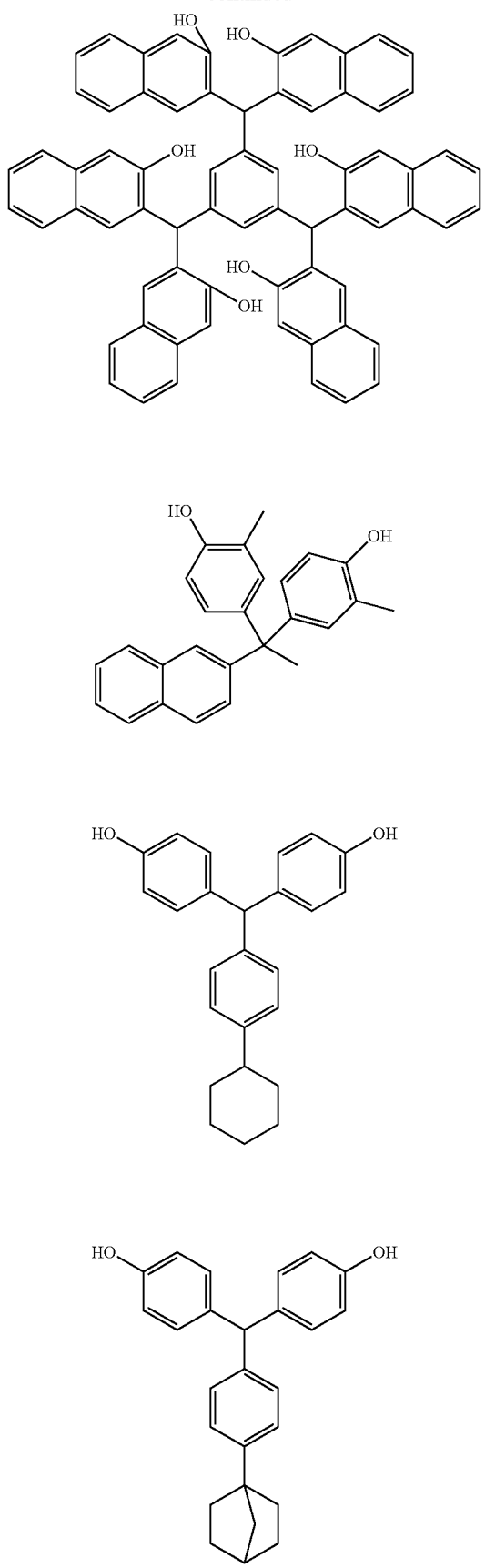

-continued
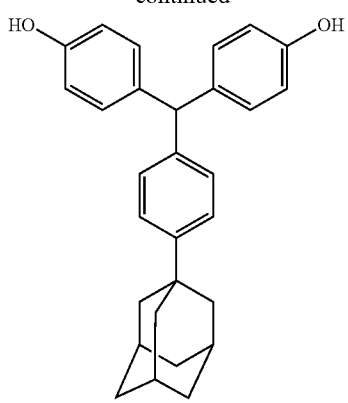
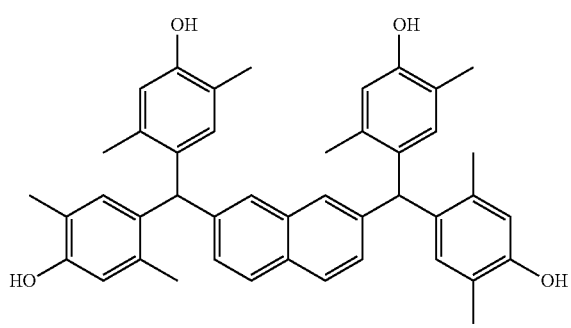
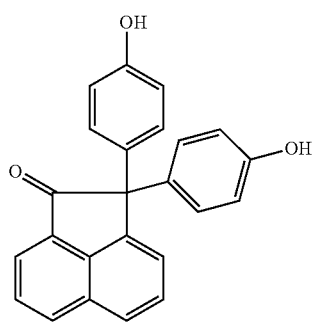
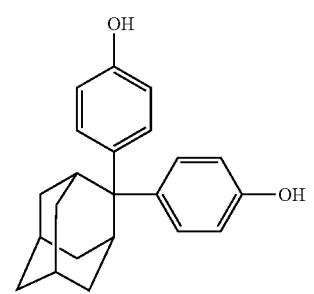
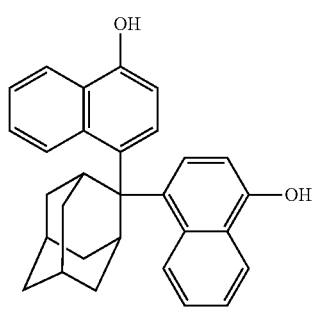
-continued
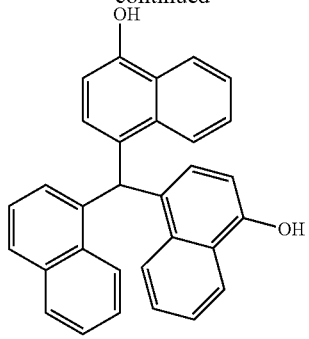
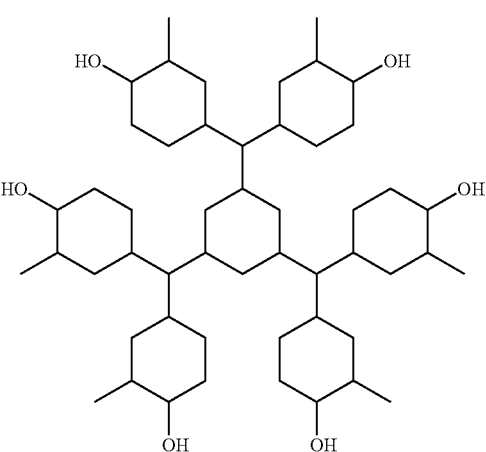
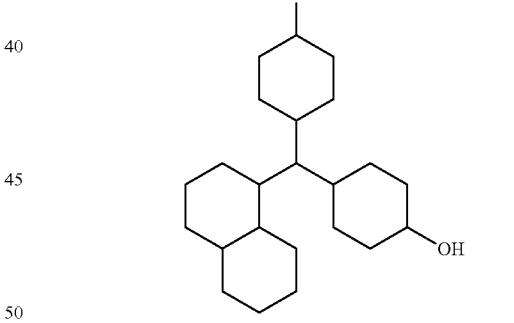
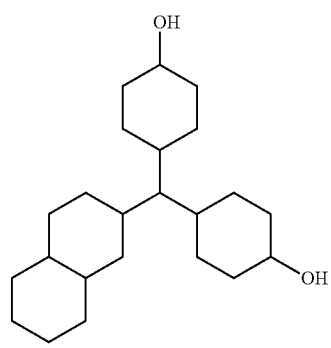

-continued
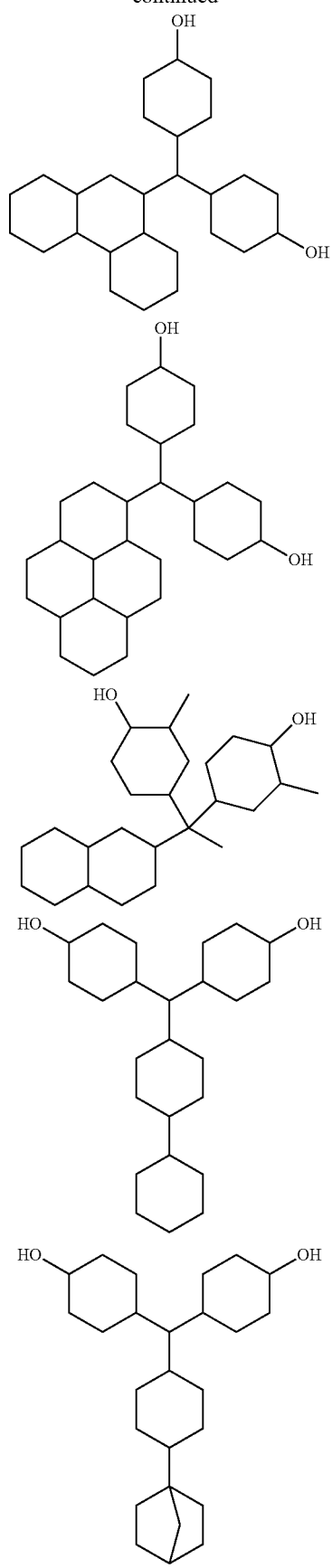
-continued
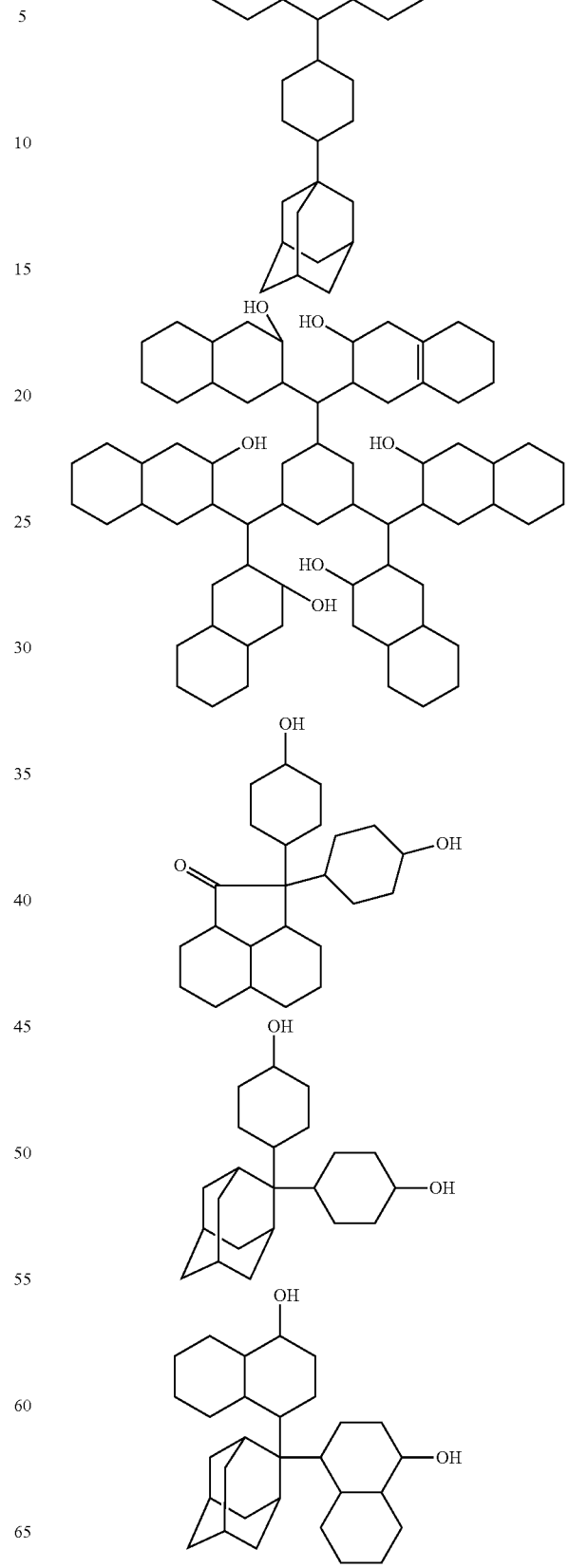

-continued

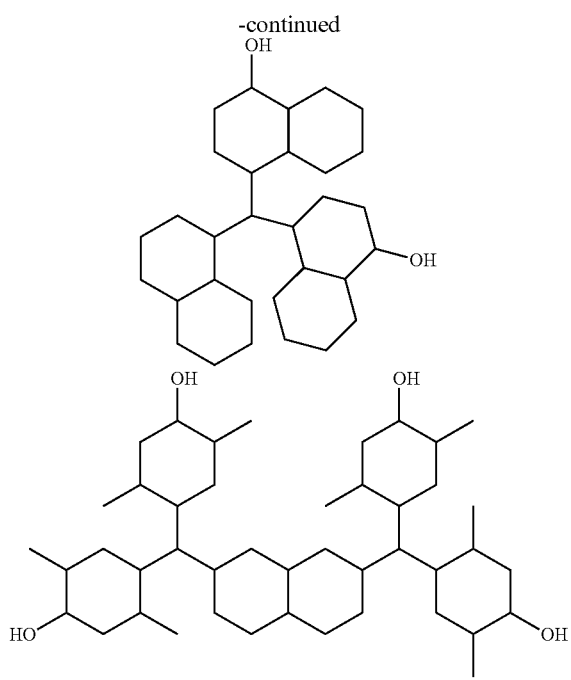

The polyphenol compound represented by the general formula (4-1) or (4-2) or the nuclear hydrogenated compound thereof preferably has a glass transition point of 110° C. or more, and more preferably 150° C. or more. When the compound has a glass transition point in the range, the composition for forming an underlayer film for lithography may have excellent film forming property. The upper limit of the glass transition point is not particularly limited, and is generally 160° C. from the standpoint of heat resistance.

The composition for forming an underlayer film for lithography of the present invention preferably contains a cyclic organic compound represented by the following formula (6) from the standpoint of enhancement of the crosslinking density:

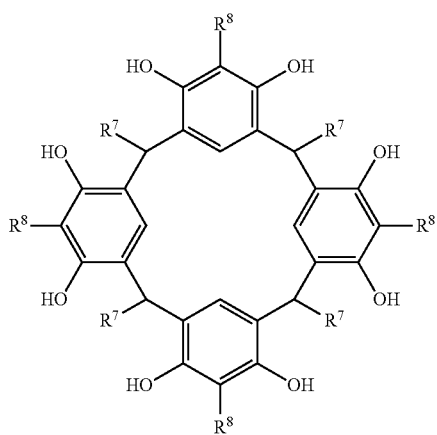 (6)

In the formula (6), $R^7$ independently represents a linear, branched or cyclic alkyl group having from 1 to 20 carbon atoms, an aryl group having from 6 to 24 carbon atoms, an allyl group, a hydroxyalkyl group, a cyanoalkyl group, a halogenoalkyl group, a hydroxyaryl group, a cyanoaryl group or a halogenoaryl group; and $R^8$ represents a hydrogen atom or a hydroxyl group.

The composition for forming an underlayer film for lithography of the present invention preferably contains a cyclic organic compound represented by the following formula (7) from the standpoint of enhancement of the crosslinking density:

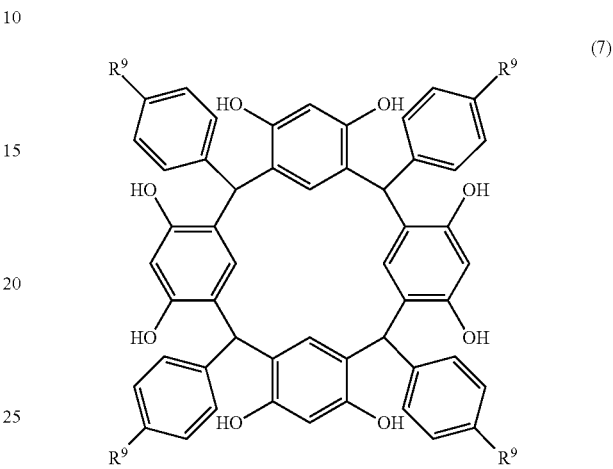 (7)

In the formula (7), $R^9$ independently represents a substituent selected from the group consisting of a hydrogen atom, an alkyl group having from 1 to 6 carbon atoms, an alkoxy group, norbornane, cyclohexane, tricyclodecane, adamantane, decalin and a bicyclooctyl group.

The composition for forming an underlayer film for lithography of the present invention may contain a crosslinking agent and an acid generator for suppressing intermixing.

Specific examples of the crosslinking agent that can be used in the present invention include a melamine compound substituted by at least one group selected from a methylol group, an alkoxymethyl group and an acyloxymethyl group, a guanamine compound, a glycoluril compound or a urea compound, an epoxy compound, a thioepoxy compound, an isocyanate compound, an azide compound and a compound having a double bond, such as an alkenyl ether group. These may be used as an additive and may be introduced for providing a crosslinkable group to the polymer side chain as a pendant group. A compound having a hydroxyl group may also be used as the crosslinking agent.

Examples of the epoxy compound among the aforementioned compounds include tris(2,3-epoxypropyl) isocyanurate, trimethylolmethane triglycidyl ether, trimethylolpropane triglycidyl ether and triethylolethane triglycidyl ether. Specific examples of the melamine compound include hexamethylolmelamine, hexamethoxymethylmelamine, a compound obtained by methoxymethylating 1 to 6 methylol groups of hexamethylolmelamine and a mixture thereof, hexamethoxyethylmelamine, hexaacyloxymethylmelamine, and a compound obtained by acyloxymethylating 1 to 6 methylol groups of hexamethylolmelamine and a mixture thereof.

Examples of the guanamine compound include tetramethylolguanamine, tetramethoxymethylguanamine, a compound obtained by methoxymethylating 1 to 4 methylol groups of tetramethylolguanamine and a mixture thereof, tetramethoxyethylguanamine, tetraacyloxyguanamine, and a compound obtained by acyloxymethylating 1 to 4 methylol groups of tetramethylolguanamine and a mixture thereof. Examples of the glycoluril compound include tetramethylolglycoluril, tetramethoxyglycoluril, tetramethoxymethylglycoluril, a compound obtained by methoxymethylating 1 to 4 methylol groups of tetramethylolglycoluril and a mixture thereof, and a compound obtained by acyloxymethylating 1 to 4 methylol groups of tetramethylolglycoluril and a mixture thereof. Examples of the urea compound include tetramethylolurea, tetramethoxymethylurea, a compound obtained by methoxymethylating 1 to 4 methylol groups of tetramethylolurea and a mixture thereof, and tetramethoxyethylurea.

Examples of the compound containing an alkenyl ether group include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylolpropane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether and trimethylolpropane trivinyl ether.

The amount of the crosslinking agent mixed in the present invention is preferably from 5 to 50 parts (parts by mass, hereinafter the same), and particularly preferably from 10 to 40 parts, per 100 parts of the aromatic hydrocarbon resin (polymer). When the amount is less than 5 parts, the film may cause mixing with the resist in some cases, and when the amount exceeds 50 parts, the antireflection function may be deteriorated, and the film after crosslinking suffers cracking, in some cases.

In the present invention, an acid generator may be contained for facilitating the crosslinking reaction by heat. The acid generator includes one generating an acid through thermal decomposition, one generating an acid through irradiation with light, and the like, any of which may be used.

Examples of the acid generator used in the present invention include:

(1) an onium salt represented by the following general formula (P1a-1), (P1a-2), (P1a-3) or (P1b), (2) a diazomethane derivative represented by the following general formula (P2), (3) a glyoxime derivative represented by the following general formula (P3), (4) a bissulfone derivative represented by the following general formula (P4), (5) a sulfonate ester of an N-hydroxyimide compound represented by the following general formula (P5), (6) a β-ketosulfonic acid derivative, (7) a disulfone derivative, (8) a nitrobenzyl sulfonate derivative, and (9) a sulfonate ester derivative.

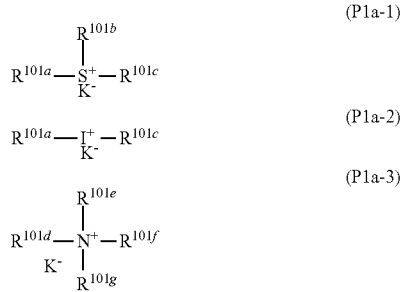

wherein $R^{101a}$, $R^{101b}$ and $R^{101c}$ each represent an alkyl group, an alkenyl group, an oxoalkyl group or an oxoalkenyl group, each of which may be linear, branched or cyclic and has from 1 to 12 carbon atoms, an aryl group having from 6 to 20 carbon atoms, or an aralkyl group or an aryloxoalkyl group, each of which has from 7 to 12 carbon atoms, and the hydrogen atoms of these groups may be partially or entirely substituted by an alkoxy group or the like. $R^{101b}$ and $R^{101c}$ may form a ring, and in the case where a ring is formed, $R^{101b}$ and $R^{101c}$ each represent an alkylene group having from 1 to 6 carbon atoms. $K^-$ represents a non-nucleophilic counter ion. $R^{101d}$, $R^{101e}$, $R^{101f}$ and $R^{101g}$ each represent a hydrogen atom or one of those groups represented by $R^{101a}$, $R^{101b}$ and $R^{101c}$. $R^{101d}$ and $R^{101e}$, and $R^{101d}$ and $R^{101e}$ and $R^{101f}$ each may form a ring, and in the case where a ring is formed, $R^{101d}$ and $R^{101e}$, and $R^{101d}$ and $R^{101e}$ and $R^{101f}$ each represent an alkylene group having from 3 to 10 carbon atoms, or each represent a heterocyclic aromatic ring containing the nitrogen atom in the formulae within the ring.

$R^{101a}$, $R^{101b}$, $R^{101c}$, $R^{101d}$, $R^{101e}$, $R^{101f}$ and $R^{101g}$ may be the same as or different from each other, and specific examples of the alkyl group include a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group and an adamantyl group. Examples of the alkenyl group include a vinyl group, an allyl group, a propenyl group, a butenyl group, a hexenyl group and a cyclohexenyl group. Examples of the oxoalkyl group include a 2-oxocyclopentyl group and a 2-oxocyclohexyl group, and also include a 2-oxopropyl group, a 2-cyclopentyl-2-oxoethyl group, a 2-cyclohexyl-2-oxoethyl group and a 2-(4-methylcyclohexyl)-2-oxoethyl group. Examples of the aryl group include a phenyl group and a naphthyl group, and also include an alkoxyphenyl group, such as a p-methoxyphenyl group, a m-methoxyphenyl group, an o-methoxyphenyl group, an ethoxyphenyl group, a p-tert-butoxyphenyl group and a m-tert-butoxyphenyl group, an alkylphenyl group, such as a 2-methylphenyl group, a 3-methylphenyl group, a 4-methylphenyl group, an ethylphenyl group, a 4-tert-butylphenyl group, a 4-butylphenyl group and a dimethylphenyl group, an alkylnaphthyl group, such as a methylnaphthyl group and an ethylnaphthyl group, an alkoxynaphthyl group, such as a methoxynaphthyl group and an ethoxynaphthyl group, a dialkylnaphthyl group, such as a dimethylnaphthyl group and a diethylnaphthyl group, and a dialkoxynaphthyl group, such as a dimethoxynaphthyl group and a diethoxynaphthyl group. Examples of the aralkyl group include a benzyl group, a phenylethyl group and a phenethyl group. Examples of the aryloxoalkyl group include a 2-aryl-2-oxoethyl group, such as a 2-phenyl-2-oxoethyl group, a 2-(1-naphthyl)-2-oxoethyl group and a 2-(2-naphthyl)-2-oxoethyl group. Examples of the non-nucleophilic counter ion represented by $K^-$ include a halide ion, such as a chloride ion and a bromide ion, a fluoroalkyl sulfonate, such as triflate, 1,1,1-trifluoroethane sulfonate and nonafluorobutane sulfonate, an aryl sulfonate, such as tosylate, benzene sulfonate, 4-fluorobenzene sulfonate and 1,2,3,4,5-pentafluorobenzene sulfonate, and an alkyl sulfonate, such as mesylate and butane sulfonate.

Examples of the heterocyclic aromatic ring containing the nitrogen atom in the formulae with the ring represented by $R^{101d}$, $R^{101e}$, $R^{101f}$ and $R^{101g}$ include an imidazole derivative (such as imidazole, 4-methylimidazole and 4-methyl-2-phenylimidazole), a pyrazole derivative, a furazane derivative, a pyrroline derivative (such as pyrroline and 2-methyl-1-pyrroline), a pyrrolidine derivative (such as pyrrolidine, N-methylpyrrolidine, pyrrolidinone and N-methylpyrrolidione), an imidazoline derivative, an imidazolidine derivative, a pyridine derivative (such as pyridine, methylpyridine, ethylpyridine, propylpyridine, butylpyricline, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine and dimethylaminopyridine), a pyridazine derivative, a pyrimidine derivative, a pyrazine derivative, a pyrazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (such as quinoline and 3-quinolinecarbonitrile), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, a 1,10-phenanthroline derivative, an adenine derivative, an adenosine derivative, a guanine derivative, a guanosine derivative, an uracil derivative, and an uridine derivative.

The general formulae (P1a-1) and (P1a-2) have both the functions of a photo acid generator and a thermal acid generator, and the general formula (P1a-3) functions as a thermal acid generator.

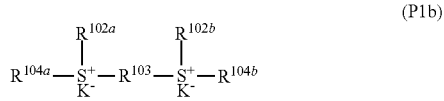

(P1b)

In the formula (P1b), $R^{102a}$ and $R^{102b}$ each represent a linear, branched or cyclic alkyl group having from 1 to 8 carbon atoms, $R^{103}$ represents a linear, branched or cyclic alkylene group having from 1 to 10 carbon atoms, $R^{104a}$ and $R^{104b}$ each represent a 2-oxoalkyl group having from 3 to 7 carbon atoms, and $K^-$ represents a non-nucleophilic counter ion.

Specific examples of $R^{102a}$ and $R^{102b}$ include a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cyclopropylmethyl group, a 4-methylcyclohexyl group and a cyclohexylmethyl group. Examples of $R^{103}$ include a methylene group, an ethylene group, a propylene group, a butylene group, a pentylene group, a hexylene group, a heptylene group, an octylene group, a nonylene group, a 1,4-cyclohexylene group, a 1,2-cyclohexylene group, a 1,3-cyclopentylene group, a 1,4-cyclooctylene group and a 1,4-cyclohexanedimethylene group. Examples of $R^{104a}$ and $R^{104b}$ include a 2-oxopropyl group, a 2-oxocyclopentyl group, a 2-oxocyclohexyl group and a 2-oxocycloheptyl group. Examples of $K^-$ include those described for the formulae (P1a-1), (P1a-2) and (P1a-3).

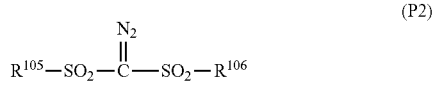

(P2)

In the formula (P2), $R^{105}$ and $R^{106}$ each represent an alkyl group or a halogenated alkyl group, each of which may be linear, branched or cyclic and has from 1 to 12 carbon atoms, an aryl group or a halogenated aryl group, each of which has from 6 to 20 carbon atoms, or an aralkyl group having from 7 to 12 carbon atoms.

Examples of the alkyl group of $R^{105}$ and $R^{106}$ include a methyl group, an ethyl group, a propyl group, an isopropyl group, a n-butyl group, a sec-butyl group, a tert-butyl group, a pentyl group, a hexyl group, a heptyl group, an octyl group, an amyl group, a cyclopentyl group, a cyclohexyl group, a cycloheptyl group, a norbornyl group and an adamantyl group. Examples of the halogenated alkyl group include a trifluoromethyl group, a 1,1,1-trifluoroethyl group, a 1,1,1-trichloroethyl group and a nonafluorobutyl group. Examples of the aryl group include a phenyl group, an alkoxyphenyl group, such as a p-methoxyphenyl group, a m-methoxyphenyl group, an o-methoxyphenyl group, an ethoxyphenyl group, a p-tert-butoxyphenyl group and a m-tert-butoxyphenyl group, and an alkylphenyl group, such as 2-methylphenyl group, a 3-methylphenyl group, a 4-methylphenyl group, an ethylphenyl group, a 4-tert-butylphenyl group, a 4-butylphenyl group and a dimethylphenyl group. Examples of the halogenated aryl group include a fluorophenyl group, a chlorophenyl group and a 1,2,3,4,5-pentafluorophenyl group. Examples of the aralkyl group include a benzyl group and a phenethyl group.

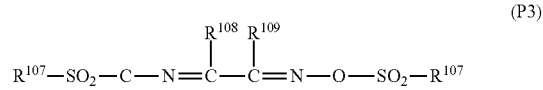

(P3)

In the formula (P3), $R^{107}$, $R^{108}$ and $R^{109}$ each represent an alkyl group or a halogenated alkyl group, each of which may be linear, branched or cyclic and has from 1 to 12 carbon atoms, an aryl group or a halogenated aryl group, each of which has from 6 to 20 carbon atoms, or an aralkyl group having from 7 to 12 carbon atoms. $R^{108}$ and $R^{109}$ may be bonded to each other to form a cyclic structure, and in the case where a cyclic structure is formed, $R^{108}$ and $R^{109}$ each represent a linear or branched alkylene group having from 1 to 6 carbon atoms.

Examples of the alkyl group, the halogenated alkyl group, the aryl group, the haolgenated aryl group and the aralkyl group of $R^{107}$, $R^{108}$ and $R^{109}$ include the similar groups as described for $R^{105}$ and $R^{106}$. Examples of the alkylene group of $R^{108}$ and $R^{109}$ include a methylene group, an ethylene group, a propylene group, a butylene group and a hexylene group.

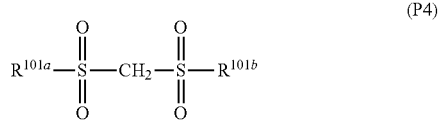

(P4)

In the formula (P4), $R^{101a}$ and $R^{101b}$ have the same meanings as above.

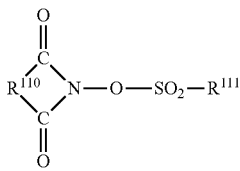

(P5)

In the formula (P5), $R^{110}$ represents an arylene group having from 6 to 10 carbon atoms, an alkylene group having from 1 to 6 carbon atoms or an alkenylene group having from 2 to 6 carbon atoms, and the hydrogen atoms of these groups may be partially or entirely substituted by an alkyl group or an alkoxy group, each of which may be linear or branched and has from 1 to 4 carbon atoms, a nitro group, an acetyl group or a phenyl group. $R^{111}$ represents an alkyl group, an alkenyl group or an alkoxyalkyl group, each of which may be linear or branched and has from 1 to 8 carbon atoms, a phenyl group or a naphthyl group, and the hydrogen atoms of these groups may be partially or entirely substituted by an alkyl group or an alkoxy group, each of which has from 1 to 4 carbon atoms; a phenyl group, which may be substituted by an alkyl group having from 1 to 4 carbon atoms, an alkoxy group, a nitro group or an acetyl group; a heterocyclic aromatic group having from 3 to 5 carbon atoms; or a chlorine atom or a fluorine atom.

Examples of the arylene group of $R^{110}$ include a 1,2-phenylene group and a 1,8-naphthyelene group, examples of the alkylene group thereof include a methylene group, an ethylene group, a trimethylene group, a tetramethylene group, a phenylethylene group and a norbornan-2,3-diyl group, and the alkenylene group thereof include a 1,2-vinylene group, a 1-phenyl-1,2-vinylene group and a 5-norbornen-2,3-diyl group. Examples of the alkyl group of $R^{111}$ include the similar group as described for $R^{101a}$ to $R^{101c}$, examples of the alkenyl group thereof include a vinyl group, a 1-propenyl group, an allyl group, a 1-butenyl group, a 3-butenyl group, an isoprenyl group, a 1-pentenyl group, a 3-pentenyl group, a 4-pentenyl group, a dimethylallyl group, a 1-hexenyl group, a 3-hexenyl group, a 5-hexenyl group, a 1-heptenyl group, a 3-heptenyl group, a 6-heptenyl group and a 7-octenyl group, and examples of the alkoxyalkyl group thereof include a methoxymethyl group, an ethoxymethyl group, a propoxymethyl group, a butoxymethyl group, a pentyloxymethyl group, a hexyloxymethyl group, a heptyloxymethyl group, a methoxyethyl group, an ethoxyethyl group, a propoxyethyl group, a butoxyethyl group, a pentyloxyethyl group, a hexyloxyethyl group, a methoxypropyl group, an ethoxypropyl group, a propoxypropyl group, a butoxypropyl group, a methoxybutyl group, an ethoxybutyl group, a propoxybutyl group, a methoxypentyl group, an ethoxypentyl group, a methoxyhexyl group and a methoxyheptyl group.

Examples of the alkyl group having from 1 to 4 carbon atoms, by which the hydrogen atoms may be substituted, include a methyl group, an ethyl group, a propyl group, an isopropyl group, a n-butyl group, an isobutyl group and a tert-butyl group, examples of the alkoxy group having from 1 to 4 carbon atoms include a methoxy group, an ethoxy group, a propoxy group, an isopropoxy group, a n-butoxy group, an isobutoxy group and a tert-butoxy group, examples of the phenyl group, which may be substituted by an alkyl group having from 1 to 4 carbon atoms, an alkoxy group, a nitro group or an acetyl group, include a phenyl group, a tolyl group, a p-tert-butoxyphenyl group, a p-acetylphenyl group and a p-nitrophenyl group, and a heterocyclic aromatic group having from 3 to 5 carbon atoms include a pyridyl group and a furyl group.

Specific examples of the acid generator include onium salts, such as tetramethylammonium trifluoromethanesulfonate, tetramethylammonium nonafluorobutanesulfonate, triethylammonium nonafluorobutanesulfonate, pyridinium nonafluorobutanesulfonate, triethylammonium camphorsulfonate, pyridinium camphorsulfonate, tetra-n-butylammonium nonafluorobutanesulfonate, tetraphenylammonium nonafluorobutanesulfonate, tetramethylammonium p-toluenesulfonate, diphenyliodonium trifluoromethanesulfonate, (p-tert-butoxyphenyl)phenyliodonium trifluoromethanesulfonate, diphenyliodonium p-toluenesulfonate, (p-tert-butoxypheyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyfl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis(methyl(2-oxocyclopentyl)sulfonium trifluoromethanesulfonate) and 1,2'-naphthylcarbonylmethyltetrahydrothiophenium triflate, diazomethane derivatives, such as bis(benzenesulfonyl)diazomethane, bis(p-toluenesulfonyl)diazomethane, bis(xylenesulfonyDdiazomethane, bis(cyclohexylsulfonyDdiazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane and 1-tert-amylsulfonyl-1-(tert-butylsulfonyl)diazomethane, glyoxime derivatives, such as bis(p-toluenesulfonyl)-α-dimethylglyoxime, bis(p-toluenesulfonyl)-α-diphenylglyoxime, bis(p-toluenesulfonyl)-α-dicyclohexylglyoxime, bis(p-toluenesulfonyl)-2,3-pentanedioneglyoxime, bis(p-toluenesulfonyl)-2-methyl-3,4-pentanedioneglyoxime, bis(n-butanesulfonyl)-α-dimethylglyoxime, bis(n-butanesulfonyp-α-diphenylglyoxime, bis(n-butanesulfonyl)-α-dicyclohexylglyoxime, bis(n-butanesulfonyl)-2,3-pentanedioneglyoxime, bis(n-butanesulfonyl)-2-methyl-3,4-pentanedioneglyoxime, bis(methanesulfonyl)-α-dimethylglyoxime, bis(trifluoromethanesulfonyl)-α-dimethylglyoxime, bis(1,1,1-trifluoroethanesulfonyl)-α-dimethylglyoxime, bis(tert-butanesulfonyn-α-dimethylglywdme, bis(perfluorooctanesulfonyl)-α- dimethylglyoxime, bis(cyclohexanesulfonyl)-α-dimethylglyoxime, bis(benzenesulfonyl)-α-dimethylglyoxime, bis(p-fluorobenzenesulfonyl)-α-dimethylglyoxime, bis(p-tert-butylbenzenesulfonyl)-α-dimethylglyoxime, bis(xylenesulfonyl)-α-dimethylglyoxime and bis(camphorsulfonyl)-α-dimethylglyoxime, bissulfone derivatives, such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane and bisbenzenesulfonylmethane, β-ketosulfone derivatives, such as 2-cyclohexylcarbonyl-2-(p-toluenesulfonyl)propane and 2-isopropylcarbonyl-2-(p-toluenesulfonyppropane, disulfone derivatives, such as a diphenyldisulfone derivative and a dicyclohexyldisulfone derivative, nitrobenzyl sulfonate derivatives, such as 2,6-dinitrobenzyl p-toluenesulfonate and 2,4-dinitrobenzyl p-toluenesulfonate, sulfonate ester derivatives, such as 1,2,3-tris(methanesulfonyloxy)benzene, 1,2,3-tris(trifluoromethanesulfonyloxy)benzene and 1,2,3-tris(p-toluenesulfonyloxy)benzene, and sulfonate ester derivatives of an N-hydroxyimide compound, such as N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-tolenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxyimide methanesulfonate, N-hydroxy-5-norbornene-2,3-dicarboxyimide trifluoromethanesulfonate and N-hydroxy-5-norbornene-2,3-dicarboxyimide p-toluenesulfonate, and in particular, onium salts, such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluene sulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornypmethyl(2-oxocyclohexyl)sulfonium trifluoromethanesulfonate and 1,2'-naphthylcarbonylmethyltetrahydrothiophenium triflate, diazomethane derivatives, such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane and bis(tert-butylsulfonyl)diazomethane, glyoxime derivatives, such as bis(p-toluenesulfonyl)-α-dimethylglyoxime and bis(n-butanesulfonyl)-α-dimethylglyoxime, bissulfone derivatives, such as bisnaphthylsulfonylmethane, and sulfonate ester derivatives of an N-hydroxyimide compound, such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate and N-hydroxynaphthalimide benzenesulfonate, are preferably used.

The acid generators described above may be used solely or as a combination of two or more kinds thereof. The amount of the acid generator added is preferably from 0.1 to 50 parts, and more preferably from 0.5 to 40 parts, per 100 parts of the aromatic hydrocarbon resin (polymer). When the amount is less than 0.1 part, the amount of an acid generated may be small to make crosslinking reaction insufficient in some cases, and when the amount exceeds 50 parts, a mixing phenomenon where an acid migrates to the resist as an upper layer may occur in some cases.

The composition for forming an underlayer film for lithography of the present invention may contains a basic compound for enhancing the storage stability.

The basic compound functions as a quencher to an acid for preventing the progress of crosslinking reaction derived by an acid that is generated in a slight amount from the acid generator. Examples of the basic compound include primary, secondary and tertiary aliphatic amine compounds, a mixed amine compound, an aromatic amine compound, a heterocyclic amine compound a nitrogen-containing compound having a carboxyl group, a nitrogen-containing compound having a sulfonyl group, a nitrogen-containing compound having a hydroxyl group, a nitrogen-containing compound having a hydroxyphenyl group, an alcoholic nitrogen-containing compound, an amide derivative and an imide derivative.

Specifically, examples of the primary aliphatic amine compound include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine and tetraethylenepentamine, examples of the secondary aliphatic amine compound include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine and N,N-dimethyltetraethylenepentamine, and examples of the tertiary amine compound include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine and N,N,N',N'-tetramethyltetraethylenepentamine.

Examples of the mixed amine compound include dimethylethylamine, methylethylpropylamine, benzylamine, phenethylamine and benzyldimethylamine. Specific examples of the aromatic amine compound and the heterocyclic amine compound include an aniline derivative (such as aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline and N,N-dimethyltoluidine), diphenyl(p-tolynamine, methyldiphenylamine, triphenylamine, phenylenediamine, naphthylamine, diaminonaphthalene, a pyrrole derivative (such as pyrrole, 2H-pyrrole, 1-methylpyrrole, 2,4-dimethylpyrrole, 2,5-dimethylpyrrole and N-methylpyrrole), an oxazole derivative (such as oxazole and isooxazole), a thiazole derivative (such as thiazole and isothiazole), an imidazole derivative (such as imidazole, 4-methylimidazole and 4-methyl-2-phenylimidazole), a pyrazole derivative, a furazane derivative, a pyrroline derivative (such as pyrroline and 2-methyl-1-pyrroline), a pyrrolidine derivative (such as pyrrolidine, N-methylpyrrolidine, pyrrolidinone and N-methylpyrrolidone), an imidazoline derivative, an imidazolidine derivative, a pyridine derivative (such as pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine and dimethylaminopyridine), a pyridazine derivative, a pyrimidine derivative, a pyrazine derivative, a pyrazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (such as quinoline and 3-quinolinecarbonitrile), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, a 1,10-phenanthroline derivative, an adenine derivative, an adenosine derivative, a guanine derivative, a guanosine derivative, an uracil derivative, and an uridine derivative.

Examples of the nitrogen-containing compound having a carboxyl group include aminobenzoic acid, indole carboxylic acid, and an amino acid derivative (such as nicotinic acid, alanine, arginine, asparaginic acid, glutamic acid, glycine, histidine, isoleucine, glycylleucine, leucine, methionine, phenylalanine, threonine, lysine, 3-aminopyrazine-2-carboxylic acid and methoxyalanine), examples of the nitrogen-containing compound having a sulfonyl group include 3-pyridinesulfonic acid and pyridinium p-toluenesulfonate, and examples of the nitrogen-containing compound having a hydroxyl group, the nitrogen-containing compound having a hydroxyphenyl group and the alcoholic nitrogen-containing compound include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyppyridine, 1-(2-hydroxyethyl)piperazine, 1-(2-(2-hydroxyethoxy)ethyl)piperazine, piperidineethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidineethanol, 1-aziridineethanol, N-(2-hydroxyethyl)phthalimide and N-(2-hydroxyethyl)isonicotinamide. Examples of the amide derivative include formamide, N-methylformamide, N,N-dimethylformamide, acetamide, N-methylacetamide, N,N-dimethylacetamide, propionamide and benzamide. Examples of the imide derivative include phthalimide, succinimide and maleimide.

The amount of the basic compound mixed is preferably from 0.001 to 2 parts, and particularly preferably from 0.01 to 1 part, per 100 parts of the aromatic hydrocarbon resin (polymer). When the amount mixed is less than 0.001 part, no effect may be obtained by the addition thereof, and when the amount exceeds 2 parts, the acid generated with heat may be entirely trapped to fail to perform crosslinking in some cases.

The composition for forming an underlayer film for lithography of the present invention may contain other resin and/or compound for imparting thermosetting property and controlling the light absorbance. Examples thereof include resins that have high transparency at 193 nm, such as a naphthol resin, a naphthol-modified xylene resin, a phenol-modified naphthalene resin, polyhydroxystyrene, a dicyclopentadiene resin, a resin containing a (meth)acrylate, a dimethacrylate, a trimethacrylate, a tetramethacrylate, a naphthalene ring, such as vinylnaphthalene and polyacenaphthene, a biphenyl ring, such as phenanthrenequinone and fluorene, or a heterocyclic ring having a hetero atom, such as thiophene and indene, and a resin containing no aromatic ring; and a resin or a compound that contains an alicyclic structure, such as a rosin resin, cyclodextrin, adamantane(poly)ol, tricyclodecane(poly)ol, and derivatives of them.

The organic solvent that can be used in the composition for forming an underlayer film for lithography of the present invention is not particularly limited as far as it dissolves the polymer, the polyphenol compound, the cyclic organic compound, the acid generator, the crosslinking agent, and other additives.

Examples thereof include a ketone solvent, such as acetone, methyl ethyl ketone, methyl isobutyl ketone and cyclohexanone, a cellosolve solvent, such as propylene glycol monomethyl ether and propylene glycol monomethyl ether acetate, an ester solvent, such as ethyl lactate, methyl acetate, ethyl acetate, butyl acetate, isoamyl acetate, ethyl lactate, methyl methoxypropionate and methyl hydroxyisobutyrate, an alcohol solvent, such as methanol, ethanol, isopropanol and 1-ethoxy-2-propanol, and an aromatic hydrocarbon, such as toluene, xylene and anisole.

Among the organic solvents, cyclohexanone, propylene glycol monomethyl ether, propylene glycol monomethyl ether acetate, ethyl lactate, methyl hydroxyisobutyrate and anisole are particularly preferred from the standpoint of safety.

The amount of the organic solvent mixed is preferably from 200 to 10,000 parts, and particularly preferably from 300 to 5,000 parts, per 100 parts of the aromatic hydrocarbon resin (polymer) from the standpoint of solubility and formation of the film.

Underlayer Film for Lithography

The underlayer film for lithography of the present invention is formed with the composition for forming an underlayer film for lithography.

The underlayer film of the present invention is preferably formed in such a manner that the composition is spin-coated, then the organic solvent is evaporated, and the composition is baked to facilitate the crosslinking reaction for preventing mixing with the resist as an upper layer. The baking temperature is preferably in a range of from 80 to 450° C., and particularly preferably from 200 to 400° C. The baking time is preferably from 10 to 300 seconds. The thickness of the underlayer film may be appropriately selected, and is preferably from 30 to 20,000 nm, and particularly preferably from 50 to 15,000 nm. After producing the underlayer film, a silicon-containing resist layer or an ordinary single resist layer containing a hydrocarbon is formed thereon in the case of a two-layer process, or a silicon-containing intermediate layer and thereon a single layer resist containing no silicon are formed thereon in the case of a three-layer process. In these cases, a known photoresist composition may be used for forming the resist layers.

The silicon-containing resist composition for a two-layer process may be a positive photoresist composition using a silicon atom-containing polymer, such as a polysilsesquioxane derivative or a vinylsilane derivative, as a base polymer, and further containing an organic solvent, an acid generator, and depending on necessity a basic compound or the like, from the standpoint of oxygen gas etching resistance. The silicon atom-containing polymer may be a known polymer that is used in resist compositions of this kind.

The silicon-containing intermediate layer for a three-layer process may be a polysilsesquioxane-based intermediate layer. Reflection may be prevented by imparting a function of an antireflection film to the intermediate layer.

When a material that contains a large amount of an aromatic group and has high etching resistance is used as an underlayer film for exposure at 193 nm, the k value is increased, and the substrate reflection is increased, but the substrate reflection can be 0.5% or less by preventing reflection with the intermediate layer.

The intermediate layer having an antireflection function used is preferably polysilsesquioxane that has a light absorbing group having a phenyl group or a silicon-silicon bond introduced for exposure at 193 nm and is crosslinked with an acid or heat, but is not particularly limited.

An intermediate layer formed by a chemical vapor deposition (CVD) method may also be used. A known intermediate layer produced by a CVD method having high antireflection function includes an SiON film. An intermediate layer formed by a spin coating method is advantageous in simplicity and cost, as compared to that formed by a CVD method. The upperlayer resist in the three-layer process may be either a positive type or a negative type, and may be the same one as used ordinarily as a single layer resist.

The underlayer film of the present invention may be used as an antireflection film for an ordinary single layer resist. The underlayer film of the present invention is excellent in resistance to etching for undercoating process, and is expected to have a function as a hardcoat for undercoating process.

Method for Forming Multilayer Resist Pattern

In the method for forming a multilayer resist pattern of the present invention, an underlayer film is formed with the composition for forming an underlayer film on a substrate; at least one photoresist layer is formed on the underlayer film; a necessary region of the photoresist layer is irradiated with a radiation; the photoresist layer is developed with an alkali to form a resist pattern; and the underlayer film is etched with plasma containing at least oxygen gas, with the resist pattern as a mask, thereby transferring the resist pattern to the underlayer film.

Upon forming the resist layer with a photoresist composition, a spin coating method may be preferably employed as similar to the case of forming the underlayer film. The resist composition is spin-coated, and then pre-baked preferably at a temperature of from 80 to 180° C. for from 10 to 300 seconds. Thereafter, the resist layer is exposed, subjected to post-exposure baking (PEB), and developed, according to ordinary methods, thereby forming a resist pattern. The thickness of the resist film is not particularly limited, and is preferably from 30 to 500 nm, and particularly preferably from 50 to 400 nm.

Examples of the exposure light include a high-energy ray with a wavelength of 300 nm or less, specifically, excimer laser of 248 nm, 193 nm or 157 nm, a soft X-ray of from 3 to 20 nm, an electron beam, and an X-ray.

Etching is then performed with the resulting resist pattern as a mask. The etching of the underlayer film in the two-layer process may be etching with oxygen gas. In addition to oxygen gas, an inert gas, such as He and Ar, and gases, such as $CO$, $CO_2$, $NH_3$, $SO_2$, $N_2$, $NO_2$ and $H_2$, may be added, and the etching may be performed only with gases, such as $CO$, $CO_2$, $NH_3$, $N_2$, $NO_2$ and $H_2$, without the use of oxygen gas. The later gases are used for protecting the side wall of the pattern for preventing undercut of the side wall. The etching of the intermediate layer in the three-layer process may be performed with a Freon gas using the resist pattern as a mask. Thereafter, the underlayer film is processed by oxygen gas etching with the pattern of the intermediate layer as a mask.

The etching of the substrate to be processed may be performed according to an ordinary method, and for example, an $SiO_2$ or SiN substrate may be etched with mainly a Freon gas, a p-Si, Al or W substrate may be etched with mainly a chlorine series or bromine series gas. In the case where the substrate is etched with a Freon gas, the silicon-containing resist in the two-layer resist process and the silicon-containing intermediate layer in the three-layer process are removed simultaneously with the process of the substrate. In the case where the substrate is etched with a chlorine series or bromine series gas, the silicon-containing resist layer and the silicon-containing intermediate layer are necessarily removed by dry etching with a Freon gas after processing the substrate.

The underlayer film of the present invention is excellent in resistance to etching of the substrate to be processed.

The substrate to be processed may be formed on a substrate. The substrate is not particularly limited and may be formed of a material that is different from the film to be processed (i.e., the substrate to be processed), examples of which include Si, α-Si, p-Si, $SiO_2$, SiN, SiON, W, TiN and Al. Examples of the film to be processed include various kinds of low-k films, such as Si, $SiO_2$, SiON, SiN, p-Si, α-Si, W, W-Si, Al, Cu and Al-Si, and stopper films therefor, which may be formed to a thickness of generally from 50 to 10,000 nm, and particularly from 100 to 5,000 nm.

EXAMPLE

The present invention will be described in more detail with reference to examples below, but the present invention is not limited to the examples.

Carbon and Oxygen Concentrations in Aromatic Hydrocarbon Resin

The carbon and oxygen concentrations (% by mass) in the aromatic hydrocarbon aldehyde resin were measured by organic elemental analysis. Apparatus: CHN Corder MT-6 (produced by Yanaco Analysis Industries, Ltd.)

Molecular Weight

The weight average molecular weight (Mw) and the number average molecular weight (Mn) as polystyrene conversion were obtained by gel permeation chromatography (GPC) analysis, and the dispersion degree (Mw/Mn) was obtained.

Apparatus: Shodex Model GPC-101 (produced by Showa Denko K.K.)
Column: LF-804×3
Eluent: THF, 1 mL/min
Temperature: 40° C.
NMR Measurement
Apparatus: JNM-AL400, produced by JEOL, Ltd.
Measurement temperature: 23° C.
Measurement solvent: $CDCl_3$
$^1H$ Measurement condition: NON, 400 MHz
$^{13}C$ Measurement condition: BCM, 100.4 MHz
IR Measurement
Apparatus: Spectrum 100, produced by Perkin-Elmer, Inc.
Measurement mode: ATR, resolution: $4.0\ cm^{-1}$ Example 1

In a four-neck flask having an internal capacity of 0.5 L equipped with a Dimroth condenser, a thermometer and stirring blades, 53 g (0.5 mol) of m-xylene (produced by Mitsubishi Gas Chemical Co., Inc.), 53 g (0.5 mol) of benzaldehyde (produced by Wako Pure Chemical Industries, Ltd.) and 5.3 g of 12 tungsto(VI) phosphoric acid n-hydrate (produced by Wako Pure Chemical Industries, Ltd.) were placed under a nitrogen stream, and heated to 140° C. and reacted for 5 hours. After diluting with 212 g of methyl isobutyl ketone (produced by Wako Pure Chemical Industries, Ltd.), the reaction mixture was neutralized and washed with water, and the solvent was removed under reduced pressure, thereby providing 61.2 g of a resin (NF-1).

The results of the GPC analysis were Mn: 683, Mw: 1,204, and Mw/Mn: 1.76. The results of the organic elemental analysis were a carbon concentration of 91.4% by mass and an oxygen concentration of 0.2% by mass.

Example 2

In a four-neck flask having an internal capacity of 0.5 L equipped with a Dimroth condenser, a thermometer and stirring blades, 54.6 g (0.35 mol) of 1,5-dimethylnaphthalene (produced by Mitsubishi Gas Chemical Co., Inc.), 74.2 g (0.7 mol) of benzaldehyde (produced by Wako Pure Chemical Industries, Ltd.) and 5.2 g of 12 tungsto(VI) phosphoric acid n-hydrate (produced by Wako Pure Chemical Industries, Ltd.) were placed under a nitrogen stream, and heated to 150° C. and reacted for 8 hours. After diluting with 386 g of methyl isobutyl ketone (produced by Wako Pure Chemical Industries, Ltd.), the reaction mixture was neutralized and washed with water, and the solvent was removed under reduced pressure, thereby providing 48.9 g of a resin (NF-2).

Figure 2:
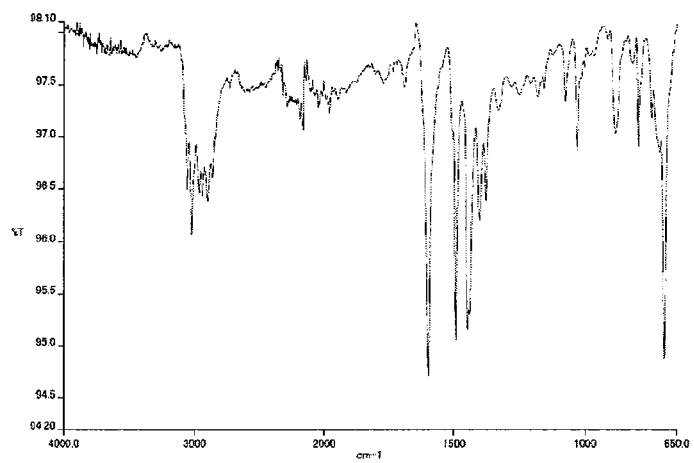
[FIG. 2] The figure is a diagram showing the IR spectrum of the resin (NF-2) obtained in Example 2 according to the present invention.

The results of the GPC analysis were Mn: 835, Mw: 1,515, and Mw/Mn: 1.81. The results of the organic elemental analysis were a carbon concentration of 92.8% by mass and an oxygen concentration of 0.4% by mass. The results of the $^1H$- and $^{13}C$-NMR measurements are shown in FIG. 1 and the following, and the results of the IR measurement were shown in FIG. 2.
NMR: δ (ppm)
  $δ_H$ ($CDCl_3$) 3.5-4.5 (methine hydrogen)
  $δ_C$ ($CDCl_3$) 35-50 (methine carbon)

Example 3

In a four-neck flask having an internal capacity of 0.5 L equipped with a Dimroth condenser, a thermometer and stirring blades, 78 g (0.5 mol) of 1,5-dimethylnaphthalene (produced by Mitsubishi Gas Chemical Co., Inc.), 30.5 g (0.25 mol) of hydroxybenzaldehyde (produced by Wako Pure Chemical Industries, Ltd.) and 1.1 g of p-toluenesulfonic acid (produced by Wako Pure Chemical Industries, Ltd.) were placed under a nitrogen stream, and heated to 120° C. and reacted for 3 hours. After diluting with 326 g of methyl isobutyl ketone (produced by Wako Pure Chemical Industries, Ltd.), the reaction mixture was neutralized and washed with water, and the solvent was removed under reduced pressure, thereby providing 79.3 g of a resin (NF-3).

The results of the GPC analysis were Mn: 1,231, Mw: 3,982, and Mw/Mn: 3.23. The results of the organic elemental analysis were a carbon concentration of 90.1% by mass and an oxygen concentration of 4.1% by mass.

Example 4

In a four-neck flask having an internal capacity of 0.5 L equipped with a Dimroth condenser, a thermometer and stirring blades, 78 g (0.5 mol) of 1,5-dimethylnaphthalene (produced by Mitsubishi Gas Chemical Co., Inc.), 78.0 g (0.5 mol) of 1-naphthoaldehyde (produced by Wako Pure Chemical Industries, Ltd.) and 5.2 g of 12 tungsto(VI) phosphoric acid n-hydrate (produced by Wako Pure Chemical Industries, Ltd.) were placed under a nitrogen stream, and heated to 150° C. and reacted for 8 hours. After diluting with 312 g of methyl isobutyl ketone (produced by Wako Pure Chemical Industries, Ltd.), the reaction mixture was neutralized and washed with water, and the solvent was removed under reduced pressure, thereby providing 67.2 g of a resin (NF-4).

The results of the GPC analysis were Mn: 505, Mw: 862, and Mw/Mn: 1.71. The results of the organic elemental analysis were a carbon concentration of 92.3% by mass and an oxygen concentration of 0.4% by mass.

Example 5

In a four-neck flask having an internal capacity of 0.1 L equipped with a Dimroth condenser, a thermometer and stirring blades, 78 g (0.5 mol) of 1,5-dimethylnaphthalene (produced by Mitsubishi Gas Chemical Co., Inc.), 74.1 g (0.5 mol) of p-isopropylbenzaldehyde (produced by Mitsubishi Gas Chemical Co., Inc.) and 1.5 g of 12 tungsto(VI) phosphoric acid n-hydrate (produced by Wako Pure Chemical Industries, Ltd.) were placed under a nitrogen stream, and heated to 200° C. and reacted for 8 hours. After diluting with 312 g of methyl isobutyl ketone (produced by Wako Pure Chemical Industries, Ltd.), the reaction mixture was neutralized and washed with water, and the solvent was removed under reduced pressure, thereby providing 109.1 g of a resin (NF-5).

Figure 3:
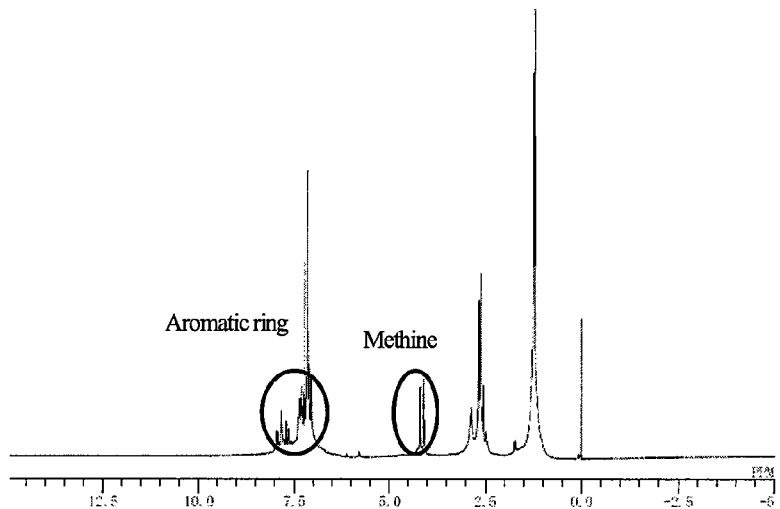
[FIG. 3] The figure is a diagram showing the $^1$H and $^{13}$C NMR spectra of the resin (NF-5) obtained in Example 5 according to the present invention.
Figure 3:
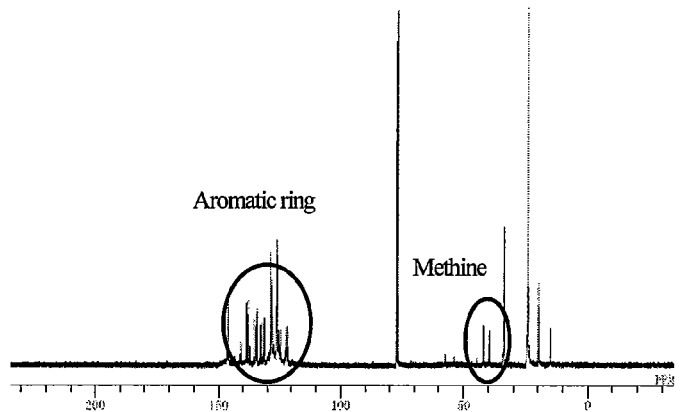
Figure 4:
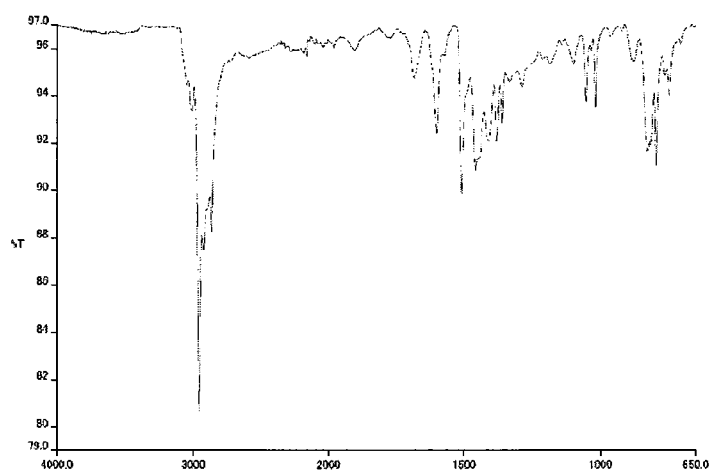
[FIG. 4] The figure is a diagram showing the IR spectrum of the resin (NF-5) obtained in Example 5 according to the present invention.

The results of the GPC analysis were Mn: 634, Mw: 1,281, and Mw/Mn: 2.02. The results of the organic elemental analysis were a carbon concentration of 92.7% by mass and an oxygen concentration of 0.3% by mass. The results of the $^1H$- and $^{13}C$-NMR measurements are shown in FIG. 3 and the following, and the results of the IR measurement were shown in FIG. 4.
NMR: δ (ppm)
  $δ_H$ ($CDCl_3$) 3.5-4.5 (methine hydrogen)
  $δ_C$ ($CDCl_3$) 35-50 (methine carbon)

Example 6

In a four-neck flask having an internal capacity of 0.5 L equipped with a Dimroth condenser, a thermometer and stirring blades, 78 g (0.5 mol) of 1,5-dimethylnaphthalene (produced by Mitsubishi Gas Chemical Co., Inc.), 45.5 g (0.25 mol) of biphenylaldehyde (produced by Mitsubishi Gas Chemical Co., Inc.) and 1.2 g of 12 tungsto(VI) phosphoric acid n-hydrate (produced by Wako Pure Chemical Industries, Ltd.) were placed under a nitrogen stream, and heated to 220° C. and reacted for 6 hours. After diluting with 247 g of methyl isobutyl ketone (produced by Wako Pure Chemical Industries, Ltd.), the reaction mixture was neutralized and washed with water, and the solvent was removed under reduced pressure, thereby providing 80.6 g of a resin (NF-6).

Figure 5:
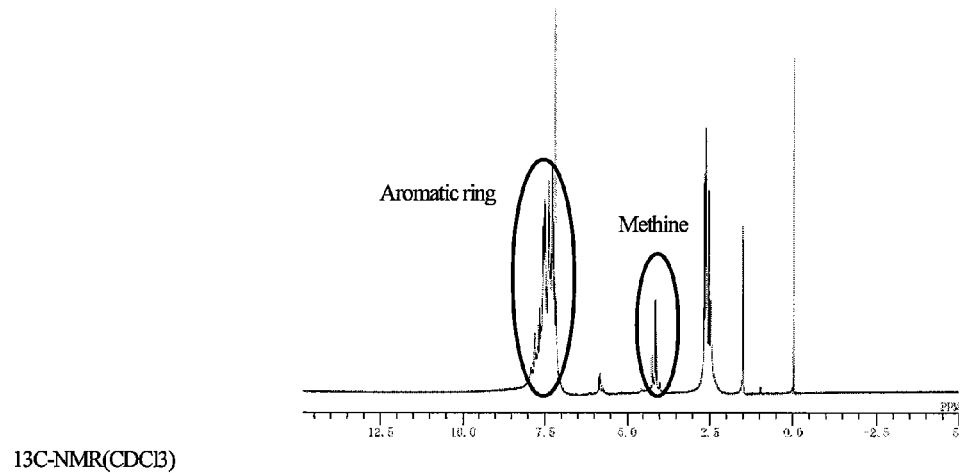
[FIG. 5] The figure is a diagram showing the $^1$H and $^{13}$C NMR spectra of the resin (NF-6) obtained in Example 6 according to the present invention.
Figure 5:
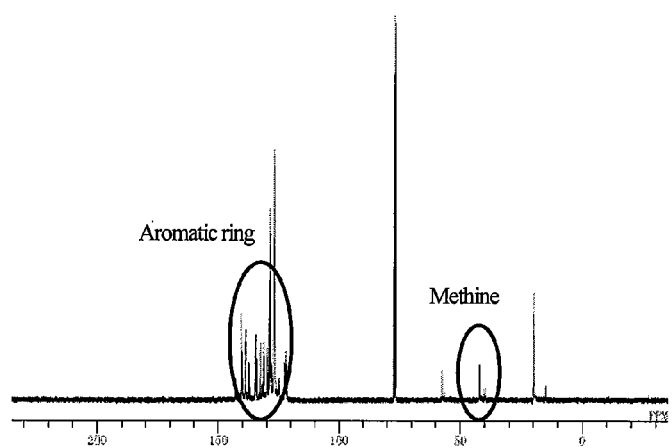
Figure 6:
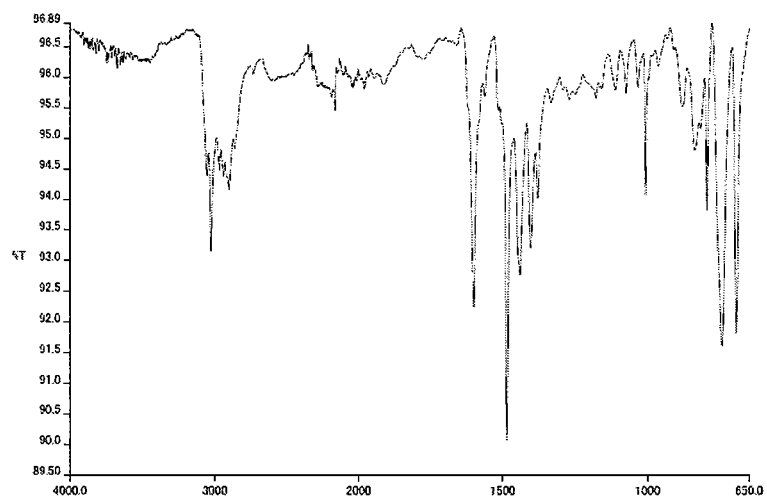
[FIG. 6] The figure is a diagram showing the IR spectrum of the resin (NF-6) obtained in Example 6 according to the present invention.

The results of the GPC analysis were Mn: 588, Mw: 956, and Mw/Mn: 1.63. The results of the organic elemental analysis were a carbon concentration of 93.3% by mass and an oxygen concentration of 0.2% by mass. The results of the $^1$H- and $^{13}$C-NMR measurements are shown in FIG. 5 and the following, and the results of the IR measurement were shown in FIG. 6.

NMR: δ (ppm)
$δ_H$ (CDCl$_3$) 3.5-4.5 (methine hydrogen)
$δ_C$ (CDCl$_3$) 35-50 (methine carbon)

Example 7

In a four-neck flask having an internal capacity of 1 L equipped with a Dimroth condenser, a thermometer and stirring blades, 141 g (1.0 mol) of 1-methylnaphthalene (produced by Kanto Chemical Co., Inc.), 182 g (1.0 mol) of biphenylaldehyde (produced by Mitsubishi Gas Chemical Co., Inc.) and 1.6 g of 12 tungsto(VI) phosphoric acid n-hydrate (produced by Wako Pure Chemical Industries, Ltd.) were placed six times with an interval of 1 hour under a nitrogen stream, and heated to 220° C. and reacted for 6 hours. After diluting with 400 g of methyl isobutyl ketone (produced by Kanto Chemical Co., Inc.) and 200 g of anisole (produced by Kanto Chemical Co., Inc.), the reaction mixture was neutralized and washed with water, and the solvents were removed under reduced pressure, thereby providing 200 g of a resin (NF-7).

Figure 7:
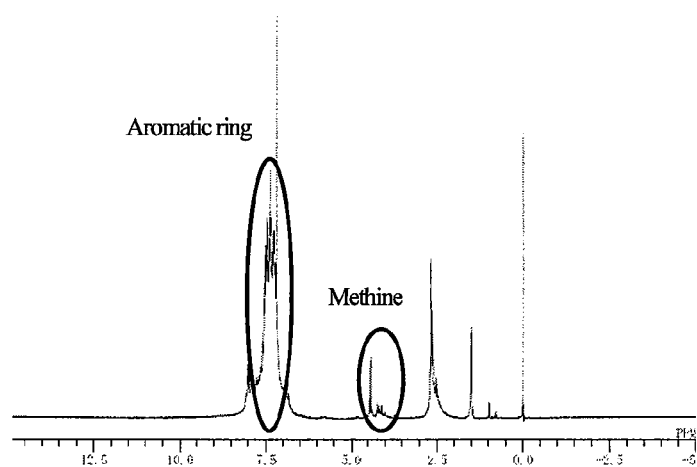
[FIG. 7] The figure is a diagram showing the $^1$H and $^{13}$C NMR spectra of the resin (NF-7) obtained in Example 7 according to the present invention.
Figure 7:
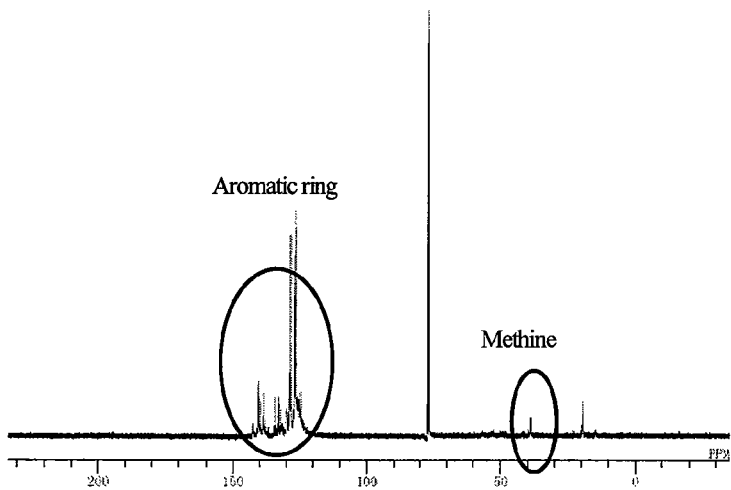
Figure 8:
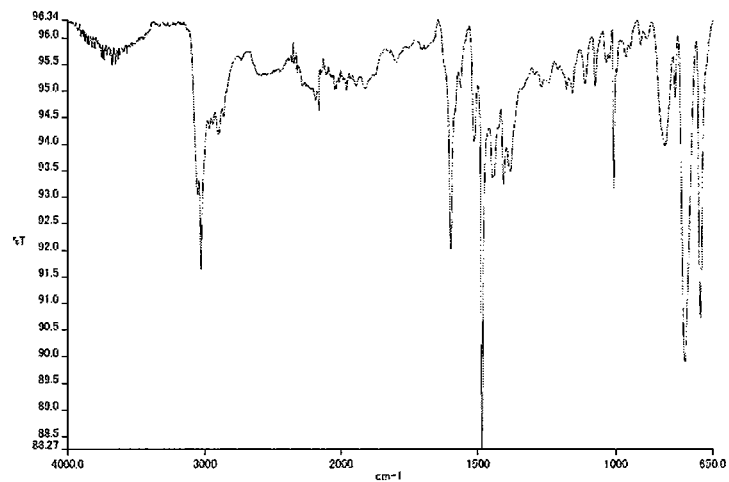
[FIG. 8] The figure is a diagram showing the IR spectrum of the resin (NF-7) obtained in Example 7 according to the present invention.

The results of the GPC analysis were Mn: 774, Mw: 1,854, and Mw/Mn: 2.40. The results of the organic elemental analysis were a carbon concentration of 93.7% by mass and an oxygen concentration of 0.4% by mass. The results of the $^1$H- and $^{13}$C-NMR measurements are shown in FIG. 7 and the following, and the results of the IR measurement were shown in FIG. 8.

NMR: δ (ppm)
$δ_H$ (CDCl$_3$) 3.5-4.5 (methine hydrogen)
$δ_C$ (CDCl$_3$) 35-50 (methine carbon)

Example 8

In a four-neck flask having an internal capacity of 1 L equipped with a Dimroth condenser, a thermometer and stirring blades, 158 g (1.3 mol) of naphthalene (produced by Kanto Chemical Co., Inc.), 228 g (1.3 mol) of biphenylaldehyde (produced by Mitsubishi Gas Chemical Co., Inc.) and 1.9 g of 12 tungsto(VI) phosphoric acid n-hydrate (produced by Wako Pure Chemical Industries, Ltd.) were placed six times with an interval of 1 hour under a nitrogen stream, and heated to 220° C. and reacted for 6 hours. After diluting with 400 g of methyl isobutyl ketone (produced by Kanto Chemical Co., Inc.) and 200 g of anisole (produced by Kanto Chemical Co., Inc.), the reaction mixture was neutralized and washed with water, and the solvents were removed under reduced pressure, thereby providing 270 g of a resin (NF-8).

Figure 9:
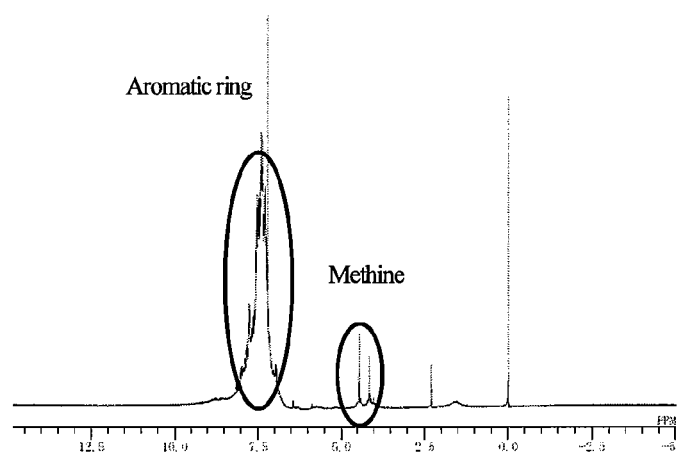
[FIG. 9] The figure is a diagram showing the $^1$H and $^{13}$C NMR spectra of the resin (NF-8) obtained in Example 8 according to the present invention.
Figure 9:
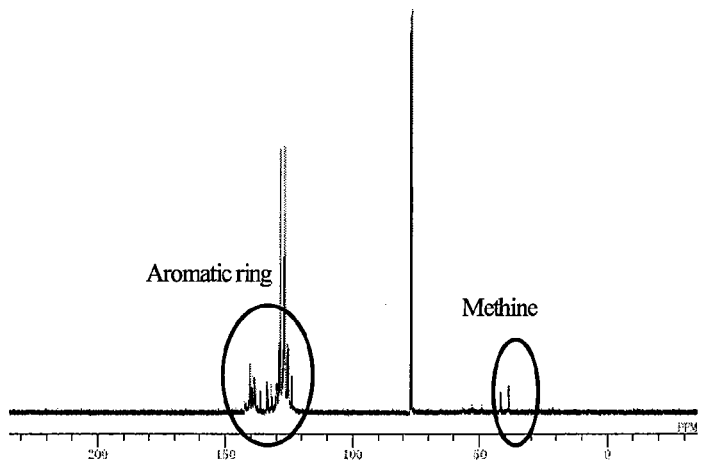
Figure 10:
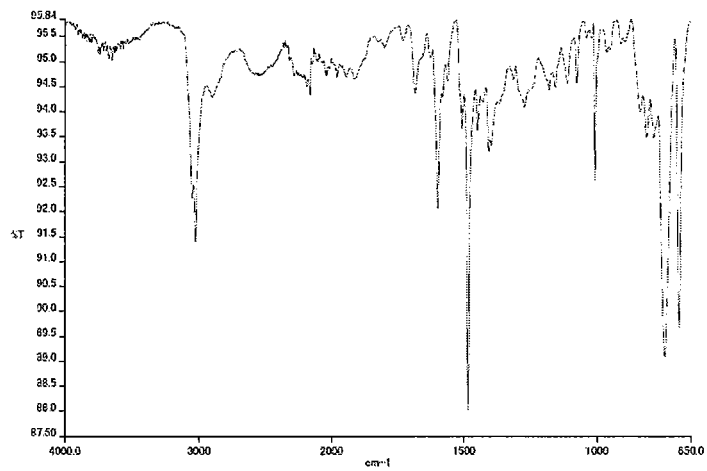
[FIG. 10] The figure is a diagram showing the IR spectrum of the resin (NF-8) obtained in Example 8 according to the present invention.

The results of the GPC analysis were Mn: 847, Mw: 3,358, and Mw/Mn: 3.96. The results of the organic elemental analysis were a carbon concentration of 94.3% by mass and an oxygen concentration of 0.0% by mass. The results of the $^1$H- and $^{13}$C-NMR measurements are shown in FIG. 9 and the following, and the results of the IR measurement were shown in FIG. 10.

NMR: δ (ppm)
$δ_H$ (CDCl$_3$) 3.5-4.5 (methine hydrogen)
$δ_C$ (CDCl$_3$) 35-50 (methine carbon)

It is understood from the results above that the aromatic hydrocarbon resins obtained by reacting the aromatic hydrocarbon represented by the formula (1) and the aldehyde represented by the formula (2) in the presence of the acidic catalyst has a high carbon concentration and a low oxygen concentration.

Production Example 1

Production of Dimethylnaphthalene-Formaldehyde Resin

In a four-neck flask having an internal capacity of 10 L having an openable bottom, equipped with a Dimroth condenser, a thermometer and stirring blades, 1.09 kg (7 mol) of 1,5-dimethylnaphthalene (produced by Mitsubishi Gas Chemical Co., Inc.), 2.1 kg of a 40% by mass formalin aqueous solution (28 mol in terms of formaldehyde, produced by Mitsubishi Gas Chemical Co., Inc.) and 0.97 kg of 98% by mass sulfuric acid (produced by Kanto Chemical Co., Inc.) were placed under a nitrogen stream, and reacted under ordinary pressure at 100° C. under refluxing for 7 hours. 1.8 kg of ethylbenzene (guaranteed reagent, produced by Wako Pure Chemical Industries, Ltd.) as a diluting solvent was added, and after allowing to stand, the aqueous phase as the lower phase was removed. The reaction mixture was neutralized and washed with water, and ethylbenzene and unreacted 1,5-dimethylnaphthalene were distilled off under reduced pressure, thereby providing 1.25 kg of a dimethylnaphthalene-formaldehyde resin in the form of a light brown solid matter.

The results of the GPC analysis were Mn: 562, Mw: 1,168, and Mw/Mn: 2.08. The results of the organic elemental analysis were a carbon concentration of 84.2% by mass and an oxygen concentration of 8.3% by mass.

Production Example 2

In a four-neck flask having an internal capacity of 0.5 L equipped with a Dimroth condenser, a thermometer and stirring blades, 0.05 g of p-toluenesulfonic acid was added to 100 g (0.51 mol) of the resin obtained in Production Example 1 under a nitrogen stream, and the mixture was heated to 190° C. and stirred under heating for 2 hours. Thereafter, 52.0 g (0.36 mol) of 1-naphthol was added, and the mixture was heated to 220° C. and reacted for 2 hours. After diluting with a solvent, the reaction mixture was neutralized and washed with water, and the solvent was removed under reduced pressure, thereby providing 126.1 g of a modified resin (CR-1) in the form of a blackish brown solid matter.

The results of the GPC analysis were Mn: 885, Mw: 2,220, and Mw/Mn: 4.17. The results of the organic elemental analysis were a carbon concentration of 89.1% by mass and an oxygen concentration of 4.5% by mass.

Production Example 3

In a four-neck flask having an internal capacity of 0.5 L equipped with a Dimroth condenser, a thermometer and stirring blades, 0.05 g of p-toluenesulfonic acid was added to 100 g (0.51 mol) of the resin obtained in Production Example 1 under a nitrogen stream, and the mixture was heated to 190° C. and stirred under heating for 2 hours. Thereafter, 34.0 g (0.36 mol) of phenol was added, and the mixture was heated to 220° C. and reacted for 2 hours. After diluting with a solvent, the reaction mixture was neutralized and washed with water, and the solvent was removed under reduced pressure, thereby providing 104.4 g of a modified resin (CR-2) in the form of a blackish brown solid matter.

The results of the GPC analysis were Mn: 903, Mw: 3,184, and Mw/Mn: 3.53. The results of the organic elemental analysis were a carbon concentration of 88.9% by mass and an oxygen concentration of 4.2% by mass.

Examples 9 to 18 and Comparative Examples 1 and 2

Compositions for forming an underlayer film having the formulations shown in Table 1 were prepared. The composition for forming an underlayer film was spin-coated on a silicon substrate, and baked at 240° C. for 60 seconds and further at 400° C. for 120 seconds, thereby providing an underlayer film having a thickness of 200 nm. An etching test was performed under the following conditions, and the results are shown in Table 1. As the standard material, an underlayer film was obtained with Novolak under the same conditions and subjected to the etching test.

Etching apparatus: RIE-10NR, produced by SAMCO International, Inc.
Output: 50 W
Pressure: 20 Pa
Time: 2 min
Etching gas: (Ar gas flow rate)/($CF_4$ gas flow rate)/($O_2$ gas flow rate)=50/5/5 (sccm)
Evaluation of Etching Resistance
A: etching rate of −10% or less with respect to Novolak
B: etching rate of more than −10% and −5% or less with respect to Novolak
C: etching rate of more than −5% and 0% or less with respect to Novolak
D: etching rate of more than 0% and +10% or less with respect to Novolak
E: etching rate of more than +10% with respect to Novolak

TABLE 1

| | Resin or compound (part by mass) | Cross-linking agent (part by mass) | Acid generator (part by mass) | Organic solvent (part by mass) | Evaluation of etching resistance |
|---|---|---|---|---|---|
| Example 9 | NF-1 (10) | — | — | CHN (90) | B |
| Example 10 | NF-2 (10) | — | — | CHN (90) | A |
| Example 11 | NF-3 (10) | — | — | CHN (90) | A |
| Example 12 | NF-4 (10) | — | — | CHN (90) | A |
| Example 13 | NF-5 (10) | — | — | CHN (90) | A |
| Example 14 | NF-6 (10) | — | — | CHN (90) | A |
| Example 15 | NF-7 (10) | — | — | CHN (90) | A |
| Example 16 | NF-8 (10) | — | — | CHN (90) | A |
| Example 17 | NF-2 (10) | Nikalac (0.5) | DTDPI (0.1) | PGMEA (90) | A |
| Example 18 | NF-6 (10) | Nikalac (0.5) | DTDPI (0.1) | CHN (90) | A |
| Comparative Example 1 | CR-1 (10) | — | — | CHN (90) | C |
| Comparative Example 2 | CR-2 (10) | — | — | CHN (90) | D |

Acid generator: di-tert-butyldiphenyliodonium nonafluoromethanesulfonate (DTDPI), produced by Midori Kagaku Co., Ltd.
Crosslinking agent: Nikalac MX270 (Nikalac), produced by Sanwa Chemical Co., Ltd.
Organic solvent: propylene glycol monomethyl ether acetate (PGMEA), cyclohexanone (CHN)
Novolak: PSM4357, produced by Gunei Chemical Industry Co., Ltd.

Example 19

The solution of the composition for forming an underlayer film (Example 14) was coated on an $SiO_2$ substrate having a thickness of 300 nm, and baked at 240° C. for 60 seconds and further at 400° C. for 120 seconds, thereby forming an underlayer film having a thickness of 80 nm. A resist solution for ArF was coated thereon, and baked at 130° C. for 60 seconds, thereby forming a photoresist layer having a thickness of 150 nm. The resist solution for ArF was prepared by mixing 5 parts of the compound of the following formula (8), 1 part of trip he nylsulfonium nonafluoromethanesulfonate, 2 parts of tributylamine and 92 parts of PGMEA.

The resist layer was exposed with an electron beam lithography apparatus (ELS-7500, produced by Elionix, Inc., 50 keV), baked at 115° C. for 90 second (PEB), and developed with a 2.38% by mass tetramethylammonium hydroxide (TMAH) aqueous solution for 60 seconds, thereby providing a positive pattern. The resulting pattern was observed for pattern shape of 55 nmL/S (1/1), and the result is shown in Table 2.

Comparative Example 3

The same procedures as in Example 19 were performed except that the underlayer film was not formed, and the result is shown in Table 2.

TABLE 2

| | Composition for forming underlayer film | Resolution | Sensitivity |
|---|---|---|---|
| Example 19 | Example 14 | 55 nm L&S | 12 µC/cm² |
| Comparative Example 3 | none | 80 nm L&S | 26 µC/cm² |

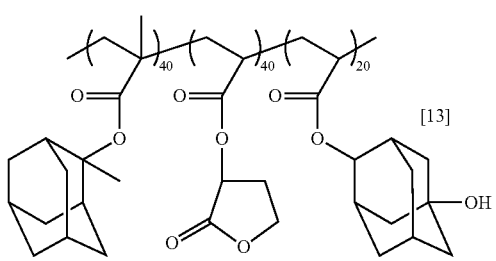

(8)

In the formula (8), the numerals 40, 40 and 20 indicate the proportions of the constitutional units, but do not mean a block copolymer.

The resist pattern thus obtained by the electron beam exposure and development was transferred to the underlayer film under the following conditions. The etching conditions were as follows.

Etching apparatus: RIE-10NR, produced by SAMCO International, Inc.

Output: 50 W

Pressure: 20 Pa

Time: 2 min

Etching gas: (Ar gas flow rate)/($CF_4$ gas flow rate)/($O_2$ gas flow rate)=50/5/5 (sccm)

The cross sections of the patterns were observed with an electron microscope (S-4800, produced by Hitachi, Ltd.), and the shapes were compared.

It was found that Example 19 using the underlayer film according to the present invention was excellent in the shape of the resist after development in the multilayer resist process and the shape of the underlayer film after oxygen etching and after etching for processing the substrate, and is also excellent in the shape after development in the case of using as a single layer resist hard mask and after etching for processing the substrate.

INDUSTRIAL APPLICABILITY

The aromatic hydrocarbon resin of the present invention is applicable to a wide range of purposes including an electric insulating material, a resist resin, a sealing resin for a semiconductor, an adhesive for a printed circuit board, an electric laminated board mounted on an electric device, an electronic device, an industrial device and the like, a matrix resin for a prepreg mounted on an electric device, an electronic device, an industrial device and the like, a material for a build-up laminated board, a resin for fiber-reinforced plastics, a sealing resin for a liquid crystal display panel, a paint composition, various kinds of coating materials, an adhesive, a coating material for a semiconductor, and a resist resin for a semiconductor.

The invention claimed is:

1. A composition for forming an underlayer film for lithography comprising an aromatic hydrocarbon resin obtained by reacting an aromatic hydrocarbon represented by the formula (1) and an aldehyde represented by the formula (2) in the presence of an acidic catalyst:

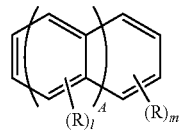

(1)

wherein R represents hydrogen or an alkyl group having from 1 to 4 carbon atoms; l and m each represents a number of 1 to 3; and A represents a number of from 0 to 1, provided that when any of l and m is 2 or more, plural groups represented by R may be the same as or different from each other,

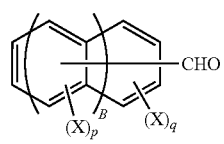

(2)

wherein X represents hydrogen, an alkyl group having from 1 to 10 carbon atoms, an aryl group having from 6 to 10 carbon atoms, a cyclohexyl group, a hydroxyl group, a formyl group or a carbonyl group; p and q each represents a number of from 1 to 3;

and B represents a number of from 0 to 2, provided that when any of p and q is 2 or more, plural groups represented by X may be the same as or different from each other;

an organic solvent; and at least one member selected from the group consisting of an acid generator and a crosslinking agent.

2. The composition for forming an underlayer film for lithography according to claim 1, wherein the aromatic hydrocarbon represented by the formula (1) is at least one member selected from benzene, toluene, xylene, trimethylbenzene, naphthalene, methylnaphthalene and dimethylnaphthalene.

3. The composition for forming an underlayer film for lithography according to claim 1, wherein the aldehyde represented by the formula (2) is at least one member selected from benzaldehyde, methylbenzaldehyde, ethylbenzaldehyde, propylbenzaldehyde, butylbenzaldehyde, cyclohexylbenzaldehyde, biphenylaldehyde, hydroxybenzaldehyde, dihydroxybenzaldehyde, naphthaldehyde and hydroxynaphthaldehyde.

4. The composition for forming an underlayer film for lithography according to claim 1, wherein the acidic catalyst is at least one member selected from hydrochloric acid, sulfuric acid, phosphoric acid, oxalic acid, formic acid, p-toluenesulfonic acid, methanesulfonic acid, trifluoroacetic acid, trifluoromethanesulfonic acid, zinc chloride, aluminum chloride, iron chloride, boron trifluoride, silicotungstic acid, phosphotungstic acid, silicomolybdic acid and phosphomolybdic acid.

5. The composition for forming an underlayer film for lithography according to claim 1, which is represented by the following formula (3):

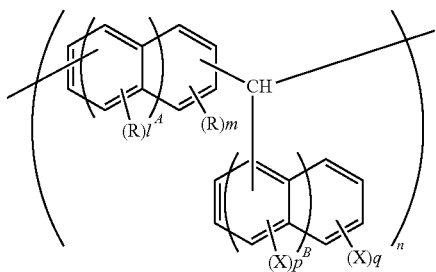

(3)

wherein n represents a number of from 1 to 50; and R, X, l, m, p and q have the same meanings as in the formulae (1) and (2).

6. The composition for forming an underlayer film for lithography according to claim 1, which has a carbon concentration of from 90 to 99.9% by mass.

7. The composition for forming an underlayer film for lithography according to claim 1, which has an oxygen concentration of from 0 to 5% by mass.

8. The composition for forming an underlayer film for lithography according to claim 1, which further comprises an acid generator.

9. The composition for forming an underlayer film for lithography according to claim 1, which further comprises a crosslinking agent.

10. An underlayer film for lithography, formed with the composition for forming an underlayer film for lithography according to claim 1.

11. A method for forming a multilayer resist pattern, comprising: forming an underlayer film with the composition for forming an underlayer film according to claim 1, on a substrate; forming at least one photoresist layer on the underlayer film; irradiating a necessary region of the photoresist layer with a radiation; developing the photoresist layer with an alkali to form a resist pattern; and etching the underlayer film with plasma containing at least oxygen gas, with the resist pattern as a mask, thereby transferring the resist pattern to the underlayer film.

* * * * *